(12) United States Patent
Chong et al.

(10) Patent No.: US 8,218,364 B2
(45) Date of Patent: Jul. 10, 2012

(54) OPERATION METHODS FOR MEMORY CELL AND ARRAY FOR REDUCING PUNCH THROUGH LEAKAGE

(75) Inventors: Lit-Ho Chong, Kulai Johor (MY); Wen-Jer Tsai, Hualien (TW); Tien-Fan Ou, Taipei (TW); Jyun-Siang Huang, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/159,413

(22) Filed: Jun. 13, 2011

(65) Prior Publication Data

US 2012/0002484 A1      Jan. 5, 2012

Related U.S. Application Data

(62) Division of application No. 12/264,886, filed on Nov. 4, 2008, now Pat. No. 7,974,127.

(60) Provisional application No. 60/985,966, filed on Nov. 6, 2007, provisional application No. 60/986,198, filed on Nov. 7, 2007, provisional application No. 60/986,479, filed on Nov. 8, 2007, provisional application No. 60/986,960, filed on Nov. 9, 2007.

(51) Int. Cl.
*G11C 11/34*    (2006.01)

(52) U.S. Cl. ......... 365/185.16; 365/185.17; 365/185.18; 365/185.24; 365/185.26; 365/185.27; 365/185.28; 365/185.29; 365/185.33

(58) Field of Classification Search ............. 365/185.16, 365/185.17, 185.18, 185.24, 185.26, 185.27, 365/185.28, 185.29, 185.33
See application file for complete search history.

(56) References Cited

U.S. PATENT DOCUMENTS

| | | | |
|---|---|---|---|
| 4,803,662 | A | 2/1989 | Tanaka |
| 5,557,569 | A | 9/1996 | Smayling et al. |
| 5,912,843 | A | 6/1999 | Jeng |
| 6,232,634 | B1 | 5/2001 | Wu et al. |
| 6,441,443 | B1 | 8/2002 | Hsu et al. |

(Continued)

FOREIGN PATENT DOCUMENTS

CN     1945837 A     4/2007

(Continued)

OTHER PUBLICATIONS

Requirement for Restriction/Election for U.S. Appl. No. 12/264,893, mailed on Sep. 8, 2011, 6 pages.

(Continued)

*Primary Examiner* — Trong Phan
(74) *Attorney, Agent, or Firm* — Kilpatrick Townsend and Stockton LLP

(57) ABSTRACT

An integrated circuit includes a memory array having a plurality of memory cells arranged in rows and columns, each memory cell including two doped regions and a channel region therebetween, each pair of adjacent memory cells sharing a common doped region, each memory cell having a charge storage member over the channel region and a control gate over the charge storage member. A first word line is coupled to the memory cells in the same row, each of the memory cells designated as the Nth memory cell. Each of a plurality of bit lines is designated as the Nth bit line, the Nth bit line coupled to a doped region shared by the Nth memory cell and the (N−1)th memory cell. The integrated circuit also has a plurality of global bit lines, each of which coupled to two of the bit lines via a switch.

34 Claims, 19 Drawing Sheets

U.S. PATENT DOCUMENTS

| | | |
|---|---|---|
| 6,667,511 B1 | 12/2003 | Fang |
| 6,690,601 B2 | 2/2004 | Yeh et al. |
| 6,757,196 B1 | 6/2004 | Tsao et al. |
| 6,903,968 B2 | 6/2005 | Jeng |
| 6,992,925 B2 | 1/2006 | Peng |
| 7,054,196 B2 | 5/2006 | Chen et al. |
| 7,057,938 B2 | 6/2006 | Yeh et al. |
| 7,072,215 B2 | 7/2006 | Chih |
| 7,099,192 B2 | 8/2006 | Wang et al. |
| 7,190,623 B2 | 3/2007 | Hsu et al. |
| 7,291,882 B2 | 11/2007 | Yang et al. |
| 7,394,703 B2 | 7/2008 | Ogura et al. |
| 7,411,836 B2 | 8/2008 | Kuo et al. |
| 7,583,530 B2 | 9/2009 | Thomas |
| 7,663,916 B2 | 2/2010 | Chih et al. |
| 7,794,127 B2 | 9/2010 | Huang et al. |
| 7,864,594 B2 | 1/2011 | Tsai et al. |
| 7,876,610 B2 | 1/2011 | Gomikawa |
| 2009/0116287 A1 | 5/2009 | Ou et al. |

FOREIGN PATENT DOCUMENTS

| | | |
|---|---|---|
| TW | 200421348 | 10/2004 |
| TW | 200423146 | 11/2004 |
| TW | 200713289 | 4/2007 |

OTHER PUBLICATIONS

Notice of Allowance for U.S. Appl. No. 12/264,886, mailed on Feb. 25, 2011, 5 pages.

Non-Final Office Action for U.S. Appl. No. 12/264,886, mailed on Nov. 3, 2010, 8 pages.

Office Action of Chinese Application No. 200810170463.7, dated Sep. 6, 2010, 4 pages total.

Requirement for Restriction/Election for U.S. Appl. No. 12/264,886, mailed on Sep. 7, 2010, 6 pages.

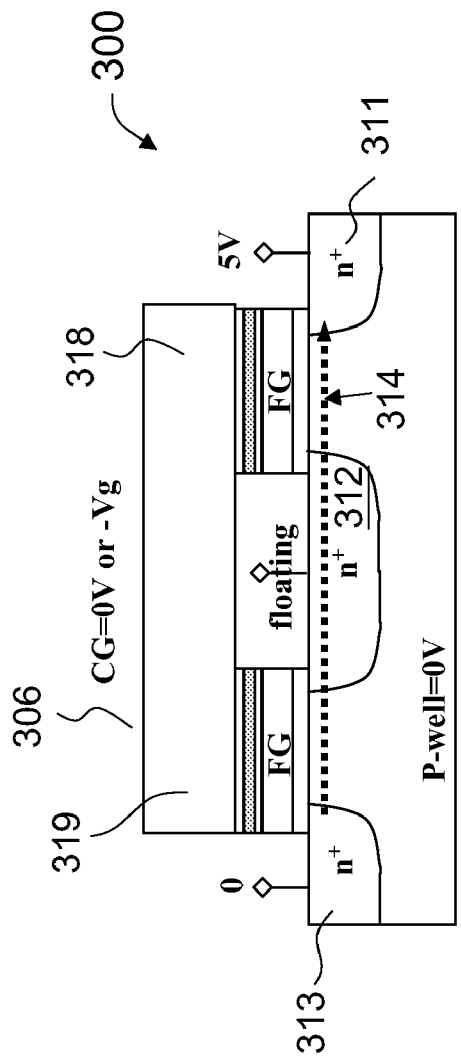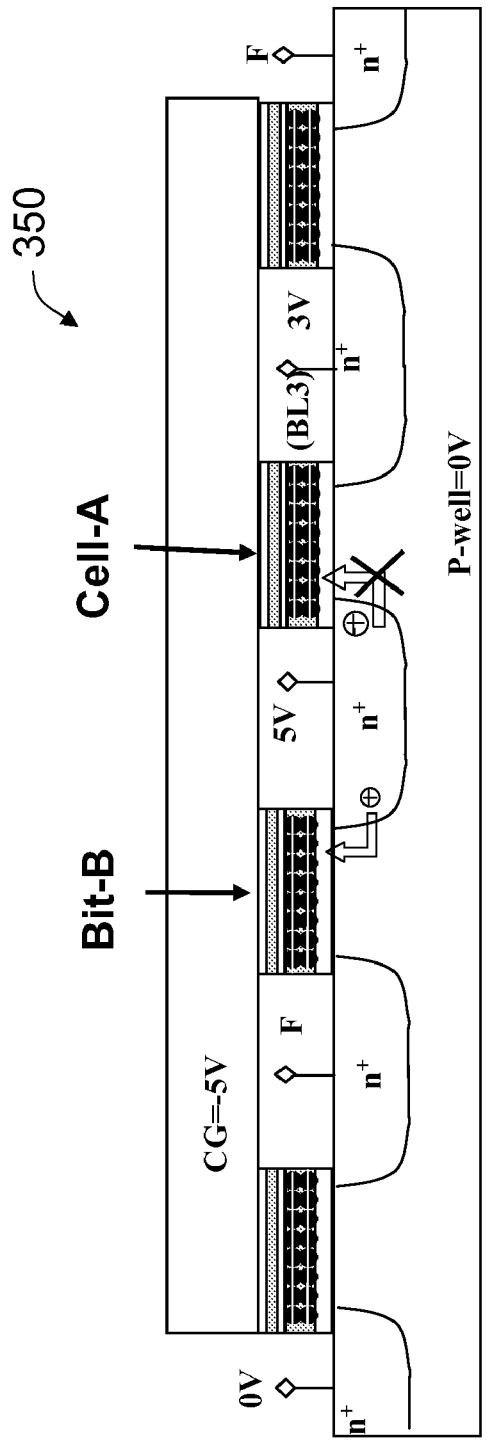

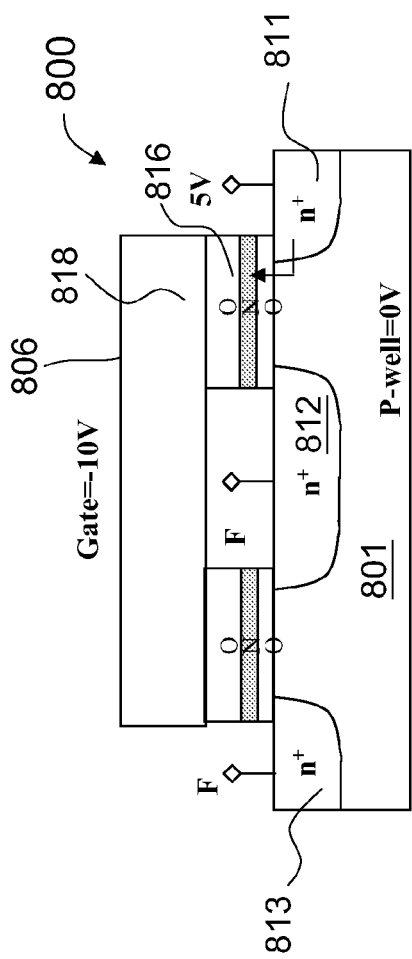
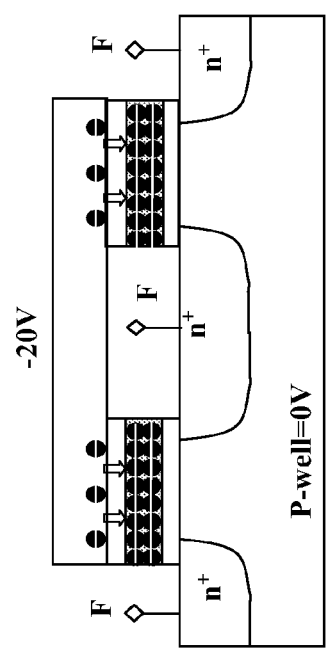
FIG. 8
FIG. 8A

OPERATION METHODS FOR MEMORY CELL AND ARRAY FOR REDUCING PUNCH THROUGH LEAKAGE

CROSS-REFERENCES TO RELATED APPLICATIONS

This application is a divisional application of U.S. patent application Ser. No. 12/264,886, filed Nov. 4, 2008, now U.S. Pat. No. 7,974,127, which claims benefit of priority to U.S. Provisional Application 60/985,966, filed. Nov. 6, 2007, U.S. Provisional Application 60/986,960 filed Nov. 9, 2007, U.S. Provisional Application 60/986,198, filed Nov. 7, 2007, and U.S. Provisional Application 60/986,479, filed Nov. 8, 2007, commonly assigned, which are incorporated in their entirety by reference for all purpose. This application is also related to concurrently filed U.S. patent application Ser. No. 13/159, 410, which is another divisional application of the parent for this application, U.S. patent application Ser. No. 12/264,886, filed Nov. 4, 2008, as described above, commonly assigned and incorporated by reference herein for all purposes. U.S. patent application Ser. No. 12/264,886 is also related to concurrently filed U.S. patent application Ser. No. 12/264,893, commonly assigned and incorporated by reference herein for all purposes.

BACKGROUND OF THE INVENTION

The present invention is directed to non-volatile memory cell arrays and their methods of operation. More particularly, the invention provides a method for programming a memory cell in a non-volatile memory cell array that reduces punch through leakage in unselected memory cells. Merely by way of example, the invention has been applied to certain non-volatile memory arrays including floating gate and nitride charge storage materials. But it would be recognized that the invention has a much broader range of applicability.

Non-volatile memory ("NVM") generally refers to semiconductor memory which is able to continually store information even when the supply of electricity is removed from the device containing the NVM cell. Conventional NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed for long term storage of programmed data. Typically, non-volatile memory can be programmed, read and/or erased based on the device's end-use requirements, and the programmed data can be stored for a long period of time.

FIG. 1 is a cross-sectional view diagram of a conventional non-volatile memory cell structure. As shown, memory cell 100 has source 102 and drain 103 formed within substrate 101. Control gate 105 overlies a charge storage material 107. The charge storage material 107 is separated from the substrate by dielectric 108. The charge storage material 107 is separated from the control gate 105 by dielectric 106. Dielectric 108 is often a tunnel oxide, and dielectric 106 is often a composite oxide-nitride-oxide (ONO) layer.

The charge storage layer 107 can include different materials and compositions. In an example, the charge storage material 107 is a floating gate. In another example, a memory cell has a so-called SONOS (silicon-oxide-nitride-oxide-silicon) structure. The nitride layer serves as a charge storage layer 107.

Non-volatile memory cell 100 can be programmed using a channel hot electron programming method. In an example, the source 102 is grounded. The drain 103 is coupled to a 4-5V voltage. A gate voltage of 8-10V is applied to control gate 105. Hot electrons are generated in the channel region and injected into the charge storage material 107. These electrons cause memory cell 100 to be programmed to a high threshold voltage state.

As discussed above, certain high voltages are applied to a memory cell during cell programming. In a memory array that includes memory cells arrange in rows and columns, the drain terminals of multiple memory cells are usually connected to a bit line, and the control gates of multiple memory cells are often connected to a word line. During a programming operation, a high voltage intended for the selected cell is also applied to a number of unselected cells that are connected to the bit line. This high voltage appears on the drain terminals of unselected memory cells and can cause high electric fields and punch through leakage in the unselected memory cells. The leakage current can result in a high power consumption of the memory chip. The leakage current can also lead to long term reliability problems of the memory cells. With continued shrinkage of semiconductor devices, the problem of punch through leakage is becoming increasingly more serious.

Accordingly, there is a need for improved methods for operating non-volatile memory cells that can reduce punch through leakage current. There is also a need for improved non-volatile memory array structures that can utilize the improved operation methods.

BRIEF SUMMARY OF THE INVENTION

The present invention is directed to non-volatile memory cell arrays and their methods of operation. More particularly, the invention provides a method for programming a memory cell in a non-volatile memory cell array that reduces punch through leakage in unselected memory cells. Merely by way of example, the invention has been applied to certain non-volatile memory arrays including floating gate and nitride charge storage materials. But it would be recognized that the invention has a much broader range of applicability.

According to a specific embodiment, the present invention provides a method for programming a first memory cell in a non-volatile memory array. In a specific embodiment, each memory cell has a drain, a source, a channel, and a control gate overlying a charge storage material and the channel. The source of the first memory cell is coupled to the drain of a second memory cell. A voltage is applied to the drain of the first memory cell, and the source of the second memory cell is grounded. The method includes floating the drain of the second memory cell and the source of the first memory cell and turning on the channels of the first and second memory cells, effectively forming an extended channel region. Hot carriers are injected to the charge storage material of the first cell to program the first memory cell. The extended channel lowers electrical fields and reduces punch through leakage in unselected memory cells.

The memory cell operations methods discussed above can be applied to nonvolatile memory arrays having different array architectures presented below according to embodiments of the invention. As noted below, in some of the operation methods, an extended channel region is provided by floating one or more doped regions between the source and drain bias terminals which receive the applied bias voltages. The electric field is reduced in the extended channel region, and punch through currents are reduced.

Various memory array architectures and operations are discussed below. It is noted that in the examples to follow, the memory cells can include floating gate or nitride in the charge storage member. The memory cells are connected in different array structures using bit lines and word lines. Additionally, various voltage sources are coupled to the bit lines and/or word lines through switch devices controlled by select lines. As shown below, during operation, different voltages are applied to bit lines and word lines, so that the terminals of the memory cells can be set at the potentials required for the different operations. Under some conditions, potentials of the select lines are raised or lowered to turn on or turn off the switch devices to allow the proper voltages to be applied to the memory cell terminals.

According to embodiments of the invention, each of the memory cells can be a multilevel memory cell. In other words, each memory cell is capable of holding multiple bits of information. For multilevel operation, the memory cell includes multiple threshold voltage targets. The programming method includes programming the memory cell until the threshold voltage of the memory cell is within a predetermined range of a predetermined threshold voltage target.

It is understood that in the operation methods discussed below, the memory cells operate like NMOS transistors, i.e., having n-type source/drain and a p-well. In alternative embodiments, memory cells configured like PMOS transistors can also be used, and the biased voltages will be adjusted accordingly.

In embodiments of the present invention, the memory cell structures and methods associated therewith can be included in various integrated circuits. In an embodiment of the invention, an integrated circuit comprises a plurality of memory cells on a substrate and a circuit unit configured to perform various steps, including:
1. selecting a first memory cell, the selected memory cell comprising a first doped region, a second doped region, a first channel region therebetween, a first charge storage member overlying the first channel region, and a first control gate overlying the first charge storage member;
2. selecting a third doped region, the third doped region being separated from the second doped region by at least a second channel region, a second control gate overlying the second channel region; and
3. applying a bias arrangement to program the first memory cell, In a specific embodiment, the bias arrangement includes:
1. applying a substrate voltage to the substrate;
2. applying a first voltage to the first doped region;
3. applying a second voltage to the third doped region;
4. applying a third voltage to the first control gate and the second control gate; and
5. floating the second doped region.

Additional methods of operation are illustrated in detail in the description to follow.

According to alternative embodiments of the present invention, the memory cell structures and operation methods associated therewith can be used to form various memory arrays. Exemplary memory arrays and operational methods are illustrated in the examples below.

Many benefits are achieved by way of the present invention over conventional techniques. For example, the present technique provides an easy to use process that relies upon conventional technology. In some embodiments, the invention provides methods for operating a virtual ground non-volatile memory array that reduces a punch through leakage current in the memory array. In some embodiment, the invention provides non-volatile memory arrays including various configu-rations of global bit lines, local bit lines, global source lines, and local source lines. In some embodiments, switch devices couple voltage sources to various bit lines and source lines. Operation methods for each array structure are also provided for reducing punch through leakage current. Additionally, the memory cells and array structures can be made using conventional process technology without substantial modifications to conventional equipment and processes. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 3 is a simplified view diagram illustrating an exemplary biasing of two unselected nonvolatile memory cells in an array according to an embodiment of the present invention;

FIG. 3A is a simplified view diagram illustrating an exemplary method for inhibiting programming disturbance in an unselected nonvolatile memory cell in an array according to an embodiment of the present invention;

FIG. 8 is a simplified view diagram illustrating a method for erasing a nitride containing nonvolatile memory cell according to an embodiment of the present invention;

FIG. 8A is a simplified view diagram illustrating a method for erasing a nitride containing nonvolatile memory cell according to another embodiment of the present invention;

DETAILED DESCRIPTION OF THE INVENTION

The present invention is directed to non-volatile memory cell arrays and their methods of operation. More particularly, the invention provides a method for programming a memory cell in a non-volatile memory cell array that reduces punch through leakage in unselected memory cells. Merely by way of example, the invention has been applied to certain nonvolatile memory arrays including floating gate and nitride charge storage materials. But it would be recognized that the invention has a much broader range of applicability.

Various operation methods and array structures will now be discussed in one or more of the embodiments to follow. Various features in these embodiments are merely examples, which should not unduly limit the scope of the claims herein. One of ordinary skill in the art would recognize many variations, modifications, and alternatives.

Figure 1:
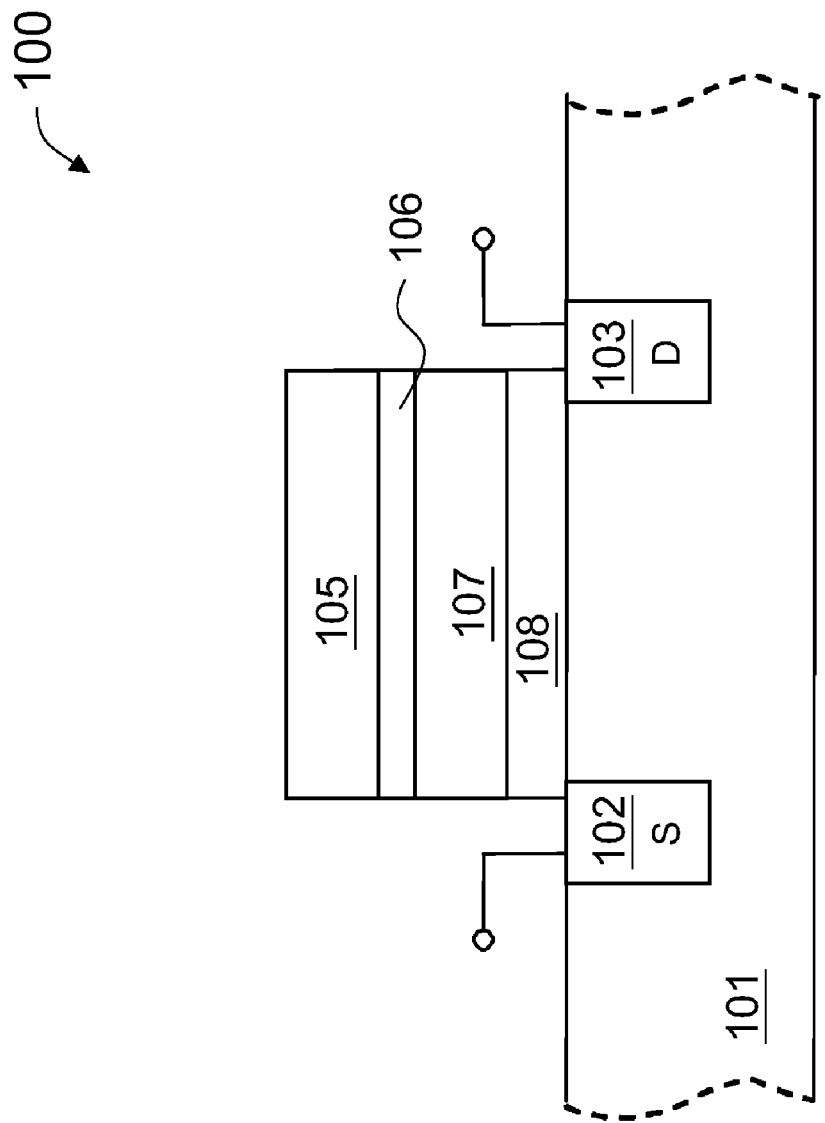
FIG. 1 is a simplified view diagram illustrating a conventional method for programming a nonvolatile memory cell.
Figure 2A:
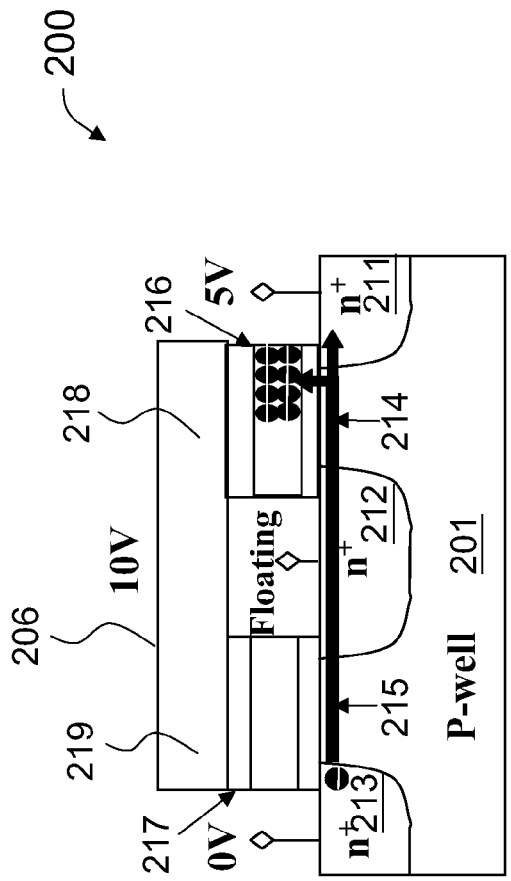
FIG. 2A is a simplified view diagram illustrating a method for programming a nonvolatile memory cell according to an embodiment of the present invention.

FIG. 2A is a simplified view diagram illustrating a method for programming a nonvolatile memory cell according to an embodiment of the present invention. This diagram is merely an example, which should not unduly limit the scope of the claims herein. One of ordinary skill in the art would recognize other variations, modifications, and alternatives. As shown, memory array device 200, which can be part of a memory array, has a semiconductor substrate of the first conductivity type, e.g. P-type well region 201 in a silicon substrate. A plurality of spaced-apart doped regions of a second conductivity type are disposed in the substrate. For example, n+ doped regions 211, 212, and 213 are located in the substrate. Depending on the embodiment, these doped regions can be used as drain or source regions in the memory cell. Channel region 214 is located between doped regions 211 and 212, and channel region 215 is located between doped regions 212 and 213. Each of the memory cells has a charge storage member overlying each of the channel regions. For example, charge storage member 216 overlies channel region 214 in the first memory cell, and charge storage member 217 overlies channel region 215 in the second memory cell. Each of the memory cells also has a control gate overlying the respective charge storage member. In device 200, control gate 218 overlies charge storage member 216 in the first memory cell, and control gate 219 overlies charge storage member 217. In a specific example, control gates 218 and 219 are connected by a word line 206 of a memory array.

In a specific example, the charge storage members 216 and 217 can be floating gates made of, e.g., polysilicon. In another example, the charge storage members 216 and 217 can include nitride containing material, e.g., in a SONOS memory cell. Of course, other charge storage material can also be used. Additionally, even though a p-type well and n+ doped regions are shown in FIG. 2A, it is understood that other alternatives can also be used. For example, p+ doped regions in an n-type well can also be used. Of course, there can be other variations, modifications, and alternatives.

According to a specific embodiment, the present invention provides methods of operating a memory cell in a non-volatile memory array device. A method of programming a memory cell is now discussed with reference to FIG. 2A. First, a memory cell is selected for programming. In this example, the memory cell on the right hand side of device 200 includes a first doped region 211, a second doped region 212, a first channel region 214 therebetween. A first charge storage member 216 overlying the first channel region 214. A first control gate 218 overlying the first charge storage member 216. The method includes selecting a third doped region 213, which is separated from the second doped region 212 by at least a second channel region 215. As shown, a second control gate 219 overlies the second channel region 215. For programming, a ground potential is applied to the substrate (p-well) 201, a first voltage (e.g. 0 V) is applied to the third doped region 213, a second voltage (e.g. 10 V) is applied to wordline 206 that connect to both the first control gate 218 and the second control gate 219 to turn on the first channel region 214, and the second channel region 215. Additionally, the second doped region 212 is maintained at a floating potential. A third voltage (e.g. 5 V) is applied to the first doped region 211. In this specific example, device 200 operates like a nonvolatile memory device having an extended channel region. Specifically, doped region 213 is the grounded source region. Channel regions 214 and 215 and the floating doped region 212 function like an extended channel. With appropriate voltages on the control gates and doped region 211 operating as the drain, channel hot electrons (CHE) are injected into the charge storage member 216 of the first memory cell on the right hand side of device 200.

Figure 2B:
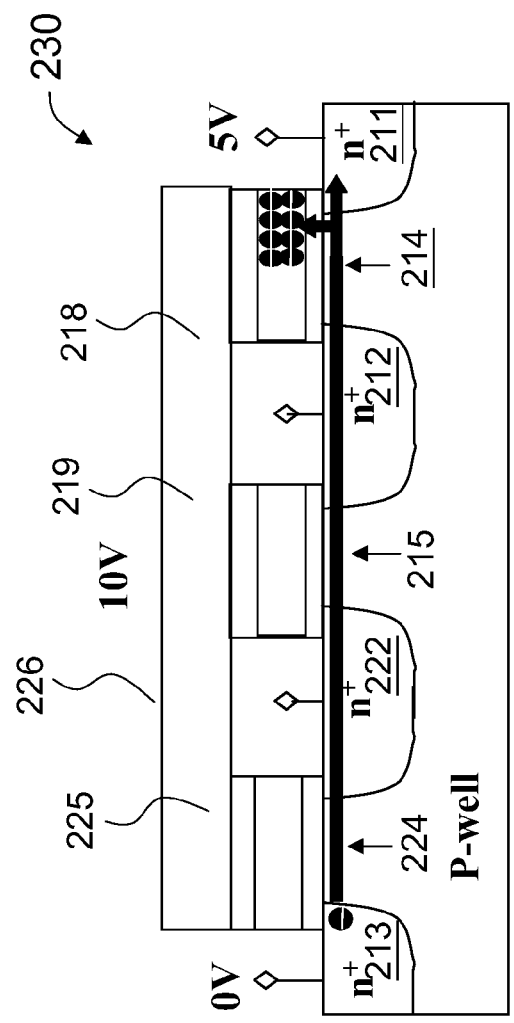
FIG. 2B is a simplified view diagram illustrating a method for programming a nonvolatile memory cell according to another embodiment of the present invention.

As another example, FIG. 2B is a simplified view diagram illustrating a method for programming a nonvolatile memory cell according to another embodiment of the present invention. As shown in memory device 230, the third doped region is separated from the second doped region 212 by two or more channel regions, such as 215 and 224. Control gates 219 and 225 overlie each of the two or more channel regions 215 and 224. For memory device 230, the programming method is similar to the method described above in connection to FIG. 2A in that an extended channel is provided, with appropriate biases applied to the additional device components. Specifically, the second voltage (e.g. 10 V) is applied to the additional control gates such as 225 as well to turn on each of the channel region. The additional doped regions, such as 222, are maintained at an electrically floating potential. In this example, control gates 218, 219, and 225 are connected to word line 226 of the memory array.

Figure 2C:
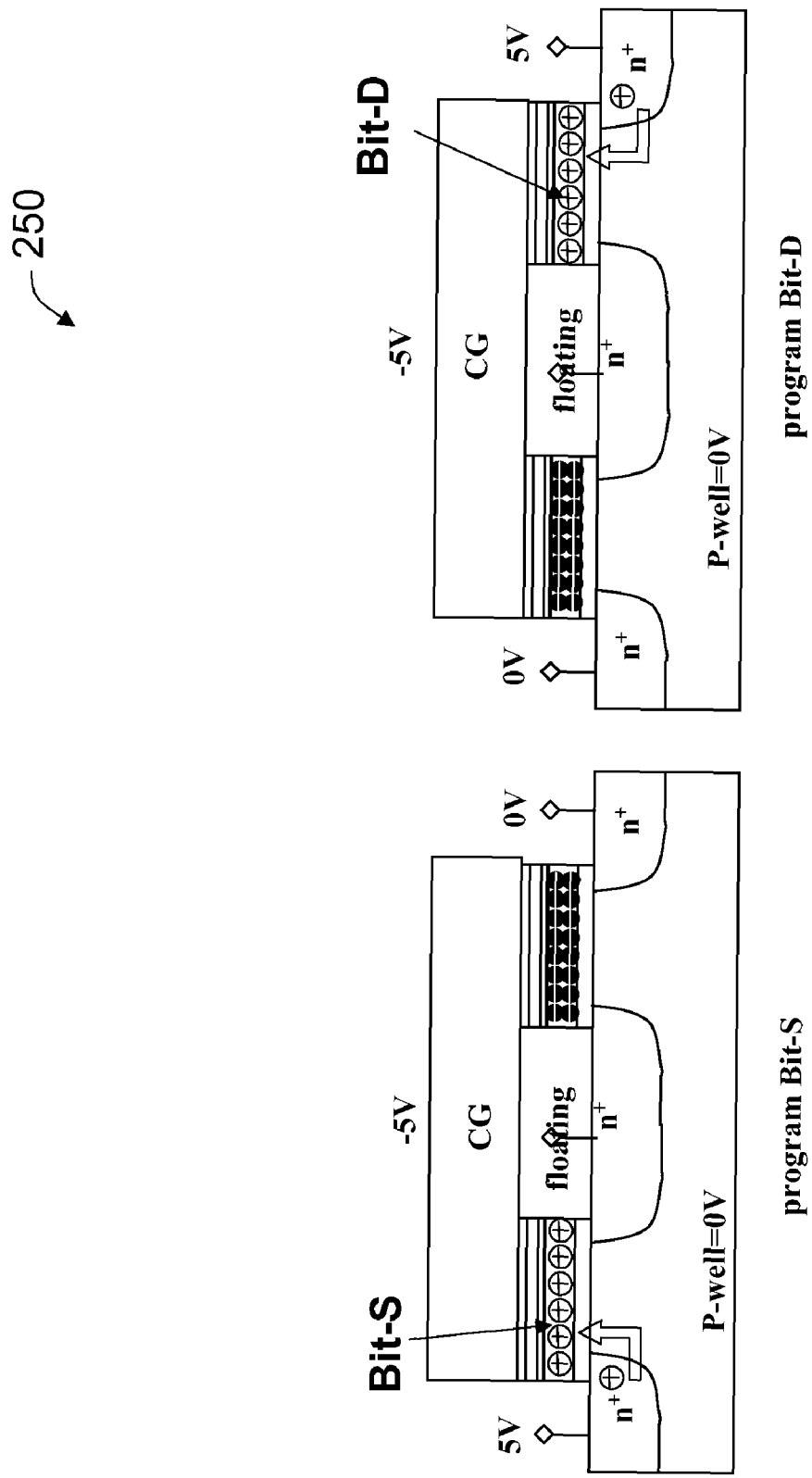
FIG. 2C is a simplified view diagram illustrating a method for programming a nonvolatile memory cell according to yet another embodiment of the present invention.

FIG. 2C is a simplified view diagram illustrating a method for programming a nonvolatile memory cell according to yet another embodiment of the present invention. In this example, the erased cell is populated with electrons and has a high Vt. The cell is programmed by band-to-band hot hole tunneling to reduced the electrons and achieve a low Vt. The bias voltages are shown in FIG. 2C. In this embodiment, the applied gate voltage (e.g. −5V) to the first and the second control gates (CG) would not turn on the first memory cell. In FIG. 2C, the memory cell on the left is labeled "program Bit-S" and illustrates a method for programming the source-side bit (Bit-S), with 5V on the source region, −5V on the control gate (CG), and 0V on the P-well. Similarly, the memory cell on the right is labeled "program Bit-D" and illustrates a method for programming the drain-side bit (Bit-D), with 5V on the drain region, −5V on the control gate (CG), and 0V on the P-well.

Although the above has been shown using a selected group of components for the device 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

According to embodiments of the invention, many benefits are provided by the programming methods described above in connection with FIGS. 2A-2C. As an example, FIG. 3 is a simplified view diagram illustrating an exemplary biasing of two unselected nonvolatile memory cells in an array according to an embodiment of the present invention. This diagram is merely an example, which should not unduly limit the scope of the claims herein. One of ordinary skill in the art would recognize other variations, modifications, and alternatives. As shown, memory device 300 is similar to memory device 200 in FIG. 2A, with CG designates control gate and FG designates floating gate. Since memory device 300 is unselected during programming, a bias voltage of 0 V or a negative gate voltage −Vg is applied to word line 306, which is connected to control gates 318 and 319. In a memory array, doped region 311 receives a voltage, e.g. 5 V. from a bit line, and doped region 313 receives a voltage, e.g. 0V from another bit line. Because doped region 312 is floating, an extended channel 314 is provided between doped regions 311 and 313. As a result, the electric field is lowered in the channel region, and punch through condition is reduced.

FIG. 3A is a simplified view diagram illustrating an exemplary method for inhibiting programming disturbance in an unselected nonvolatile memory cell in an array according to an embodiment of the present invention. FIG. 3A shows part of a memory array 350 to illustrate a method for "Floating gate cell inhibit". The control gate (CG) is biased at −5V, and the n+ doped region on the right is floating (marked by "F"). Here, the erased cell is populated with electrons and has a high Vt. Bit B is being programmed by band-to-band hot hole tunneling while programming is prohibited (marked by X) at Bit A. The bias conditions are shown in FIG. 3A in which BL3=3V that reduces the lateral field in cell A.

Figure 4:
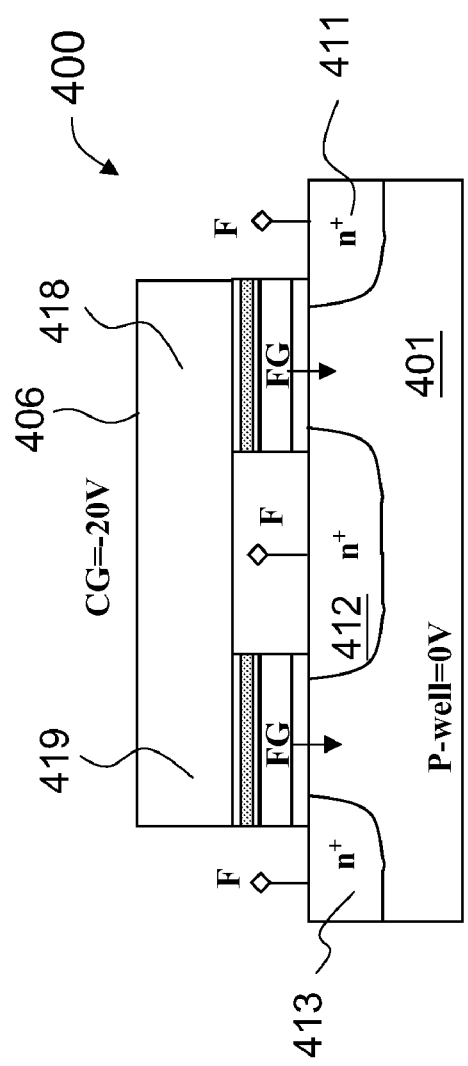
FIG. 4 is a simplified view diagram illustrating a method for erasing a floating gate nonvolatile memory cell according to an embodiment of the present invention.

FIG. 4 is a simplified view diagram illustrating a method for erasing a floating gate nonvolatile memory cell according to an embodiment of the present invention. This diagram is merely an example, which should not unduly limit the scope of the claims herein. One of ordinary skill in the art would recognize other variations, modifications, and alternatives. As shown, memory device 400 is similar to memory device 200, but the charge storage members include a floating gate (FG). During erase, a negative voltage, e.g. −20V, is applied to control gates (CG) 418 and 419 through word line 406, the substrate (p-well) 401 is maintained at 0 V, and doped regions such as 411, 412, and 413 are floating (marked by "F"). Under such bias conditions, electrons are removed from the floating gates by Fowler-Nordham tunneling. The method for erasing the memory device can also be extended to a device such as 230 by applying the negative gate voltage to the additional control gates and floating the additional doped regions.

Figure 4A:
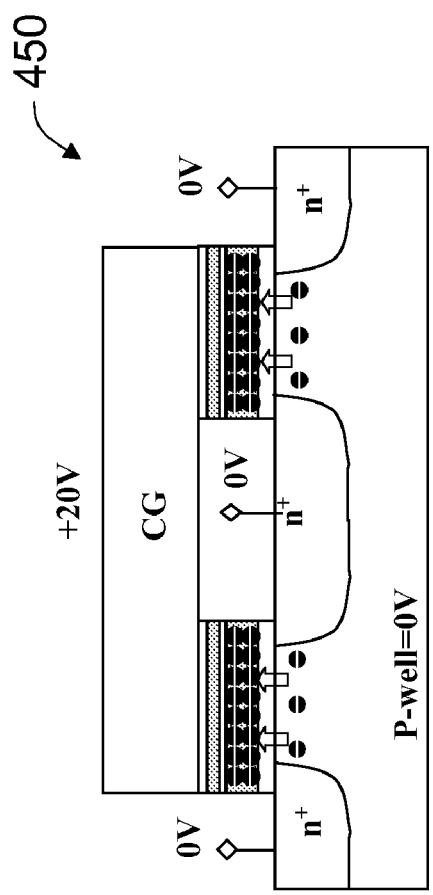
FIG. 4A is a simplified view diagram illustrating a method for erasing a floating gate nonvolatile memory cell according to another embodiment of the present invention.

FIG. 4A is a simplified view diagram illustrating a method for erasing a floating gate nonvolatile memory cell 450 according to another embodiment of the present invention. In this example, the control gate (CG) is biased at a high voltage, for example, 20V. As shown, cell erase is accomplished by FN tunneling electrons into the charge storage material, in this case, the floating gate. As a result, an erased cell has a high Vt.

Figure 5:
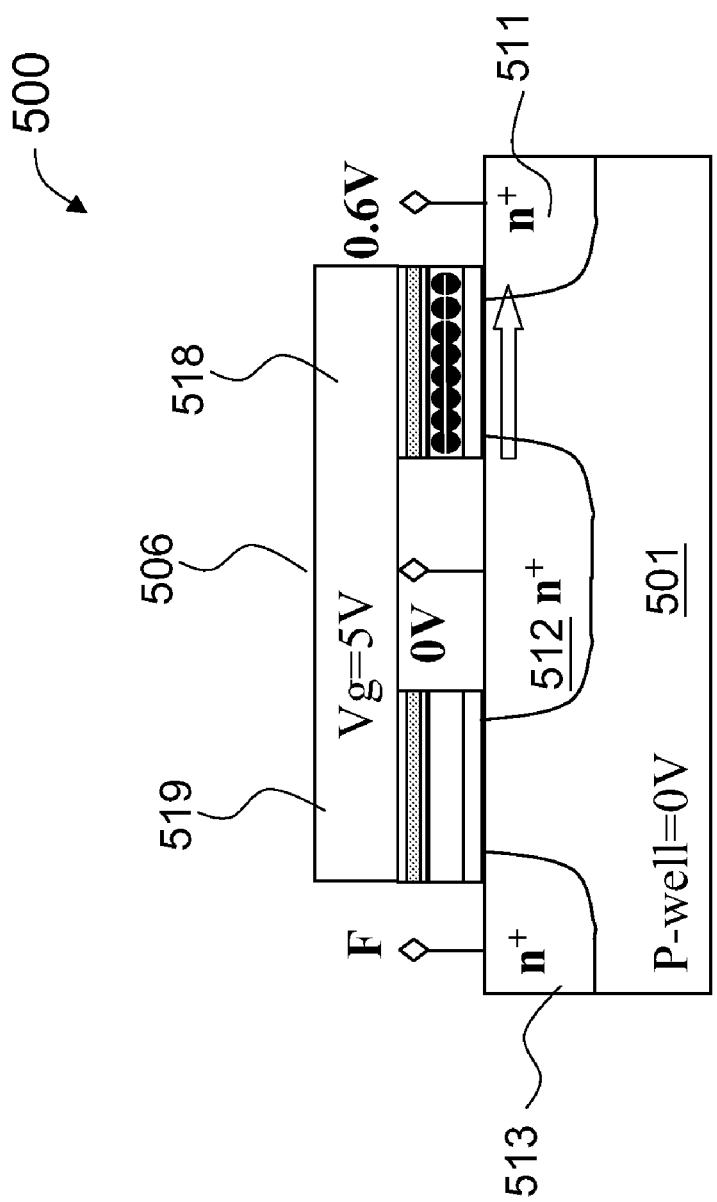
FIG. 5 is a simplified view diagram illustrating a method for reading a floating gate nonvolatile memory cell according to an embodiment of the present invention.

FIG. 5 is a simplified view diagram illustrating a method for reading a floating gate nonvolatile memory cell according to an embodiment of the present invention. This diagram is merely an example, which should not unduly limit the scope of the claims herein. One of ordinary skill in the art would recognize other variations, modifications, and alternatives. As shown, memory device 500 is similar to memory device 400, having a floating gate in the charge storage members. The method for reading includes maintaining a ground potential at the substrate (p-well) 501, maintaining a ground potential at the second doped region 512, applying a gate voltage, e.g. 5V, to the first control gate 518 through wordline 506; and applying a read drain voltage, e.g., 0.6 V, to the first doped region 511. Under this bias condition, a transistor is formed with source 512, drain 511, and gate 518. A current provide at drain 511 is related to the charge stored in the charge storage member. In an embodiment, sensing the current against predetermined reference current can provide the state of the memory cell. The drain 513 of an adjacent transistor is floating (marked by "F").

Figure 6:
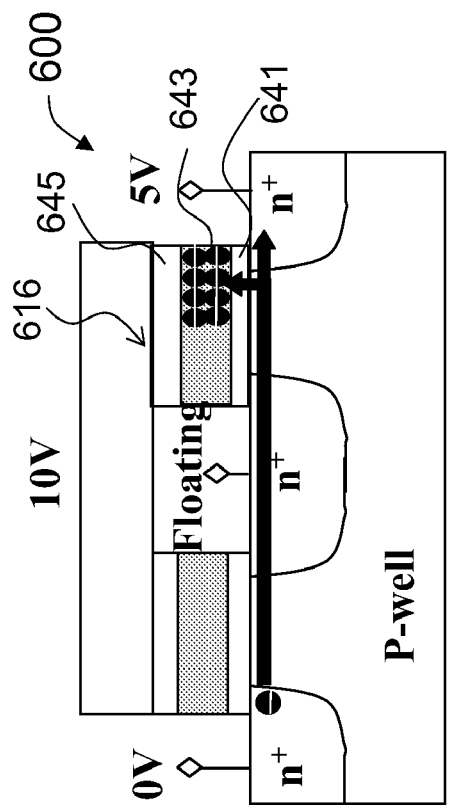
FIG. 6 is a simplified view diagram illustrating a method for programming a nitride containing nonvolatile memory cell according to an embodiment of the present invention.

FIG. 6 is a simplified view diagram illustrating a method for programming a nitride containing nonvolatile memory cell according to an embodiment of the present invention. This diagram is merely an example, which should not unduly limit the scope of the claims herein. One of ordinary skill in the art would recognize other variations, modifications, and alternatives. As shown, memory device 600 is similar to memory device 200 of FIG. 2A. The charge storage member includes a nitride containing material, e.g. in a SONOS memory cell. In a specific example, the charge storage member 616 includes an ONO layer of oxide 641, nitride 643, and oxide 645. The injected charges tend to be trapped near the drain side of the charge storage member. The method for programming is substantially the same as the method discussed above in connection with memory device 200.

Figure 6A:
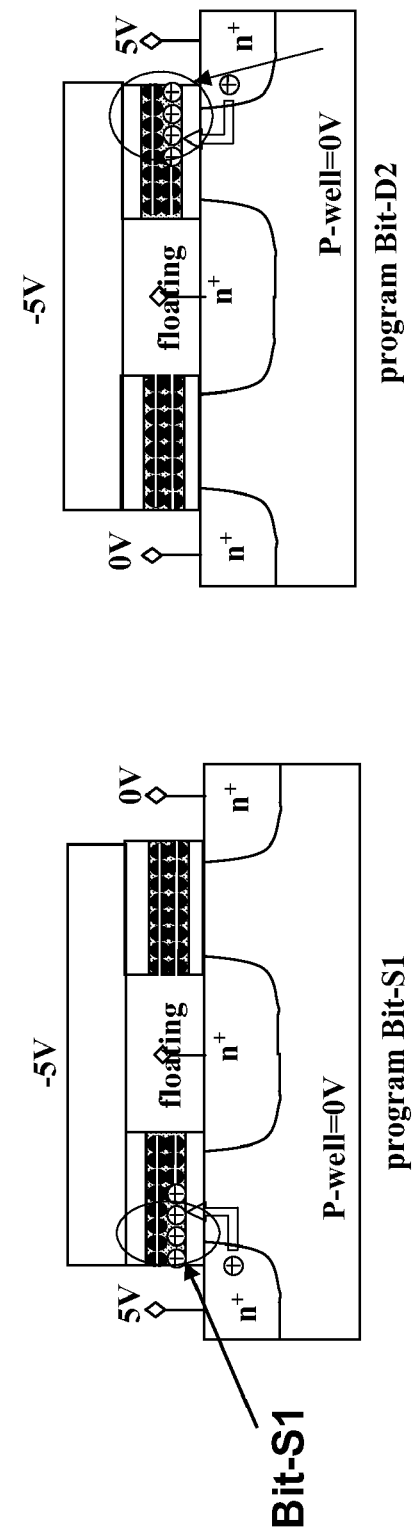
FIG. 6A is a simplified view diagram illustrating a method for programming a nitride containing nonvolatile memory cell according to another embodiment of the present invention.

FIG. 6A is a simplified view diagram illustrating a method 650 for programming a nitride containing nonvolatile memory cell according to another embodiment of the present invention. In this method, a nitride containing nonvolatile memory cell (SiN storage cell) is programmed by band-to-band (BTB) hot hole program to a low threshold voltage (Vt). The drawing on the left illustrates a method for programming a source-side bit of storage cell #1 (Bit-S1), with a gate biased at −5V, a first doped region biased at 5V, a second doped region floating (F), a third doped region biased at 0V, and the P-well biased at 0V. The drawing on the right illustrates a method for programming a drain-side bit of storage cell #2 (Bit-D2), with a gate biased at −5V, a first doped region biased at 5V, a second doped region floating (F), a third doped region biased at 0V, and the P-well biased at 0V. In this example, the erased cell is populated with electrons and has a high Vt. The cell is programmed by band-to-band (BTB) hot hole tunneling to reduced the electrons and achieve a low Vt. In both drawings, hot hole tunneling location is marked by arrow and circle.

Figure 7:
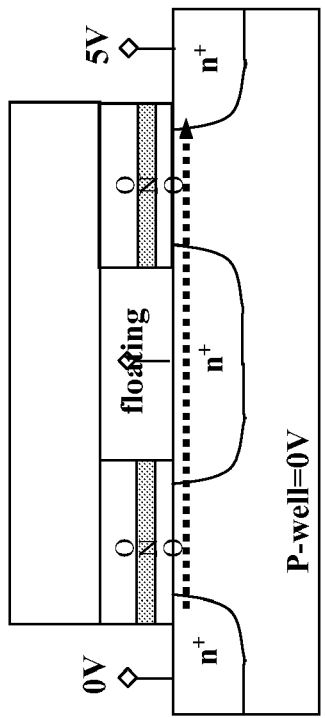
FIG. 7 is a simplified view diagram illustrating an exemplary biasing of two unselected nitride containing nonvolatile memory cells in an array according to an embodiment of the present invention.

FIG. 7 is a simplified view diagram illustrating an exemplary biasing of two unselected nitride containing nonvolatile memory cells in an array according to an embodiment of the present invention. This diagram is merely an example, which should not unduly limit the scope of the claims herein. One of ordinary skill in the art would recognize other variations, modifications, and alternatives. As shown, FIG. 7 is substantially similar to FIG. 3, illustrating a reduced punch through condition in unselected cells. Note that the nitride containing storage member is marked as O-N-O. The gate is biased at 0V or −Vg, the P-well is biased at 0V, a first doped region is biased at 0V, a second doped region is floating, and a third doped region is biased at 5V. The dotted arrow indicates a punch through direction.

Figure 7A:
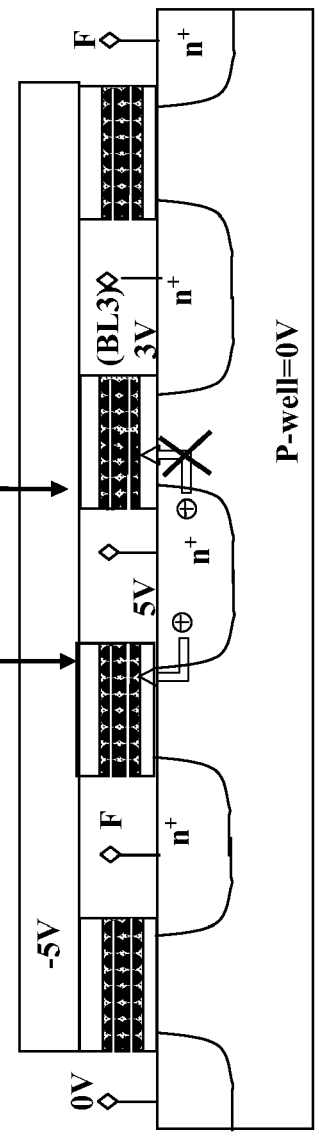
FIG. 7A is a simplified view diagram illustrating an exemplary method for inhibiting programming disturbing in an unselected nitride containing nonvolatile memory cell in an array according to an embodiment of the present invention.

FIG. 7A is a simplified view diagram illustrating an exemplary method for inhibiting programming disturbance in an unselected nitride containing nonvolatile memory cell in an array according to an embodiment of the present invention. FIG. 7A shows part of a memory array 750 to illustrate a method for nitride containing nonvolatile memory cells. Here, the erased cell is populated with electrons and has a high Vt. Bit B is being programmed by band-to-band hot hole tunneling while programming is prohibited at Bit A (marked by "X"). The bias conditions are shown in FIG. 7A in which BL3=3V that reduces the lateral field in cell A. Two of the doped regions are floating (marked by "F").

FIG. 8 is a simplified view diagram illustrating a method for erasing a nitride containing nonvolatile memory cell 800 according to an embodiment of the present invention. This diagram is merely an example, which should not unduly limit the scope of the claims herein. One of ordinary skill in the art would recognize other variations, modifications, and alternatives. As shown, to erase the electrons trapped in the nitride containing charge storage member 816 near doped region 811, a band-to-band tunneling (BTBT) condition is provided to inject hot holes (HH) to charge storage member. The biasing condition includes maintaining a ground potential at the substrate (p-well) 801, maintaining a floating potential at the second doped region 812, applying a gate voltage, e.g. −10 V to the first control gate 818 through word line 806; and applying a drain voltage, e.g. 5 V, to the first doped region 811. In FIG. 8, the gate voltage −10 V is applied to a word line 806. A third doped region 813 is floating (marked by "F").

FIG. 8A is a simplified view diagram illustrating a method for erasing a nitride containing nonvolatile memory cell according to another embodiment of the present invention. In FIG. 8A, the gate is biased at −20V, and the P-well is biased at 0V. All doped regions are left floating (A). As shown, cell erase is accomplished by FN tunneling electrons into the charge storage material, in this case, the nitride charge trapping material. As a result, an erased cell has a high Vt.

Figure 9:
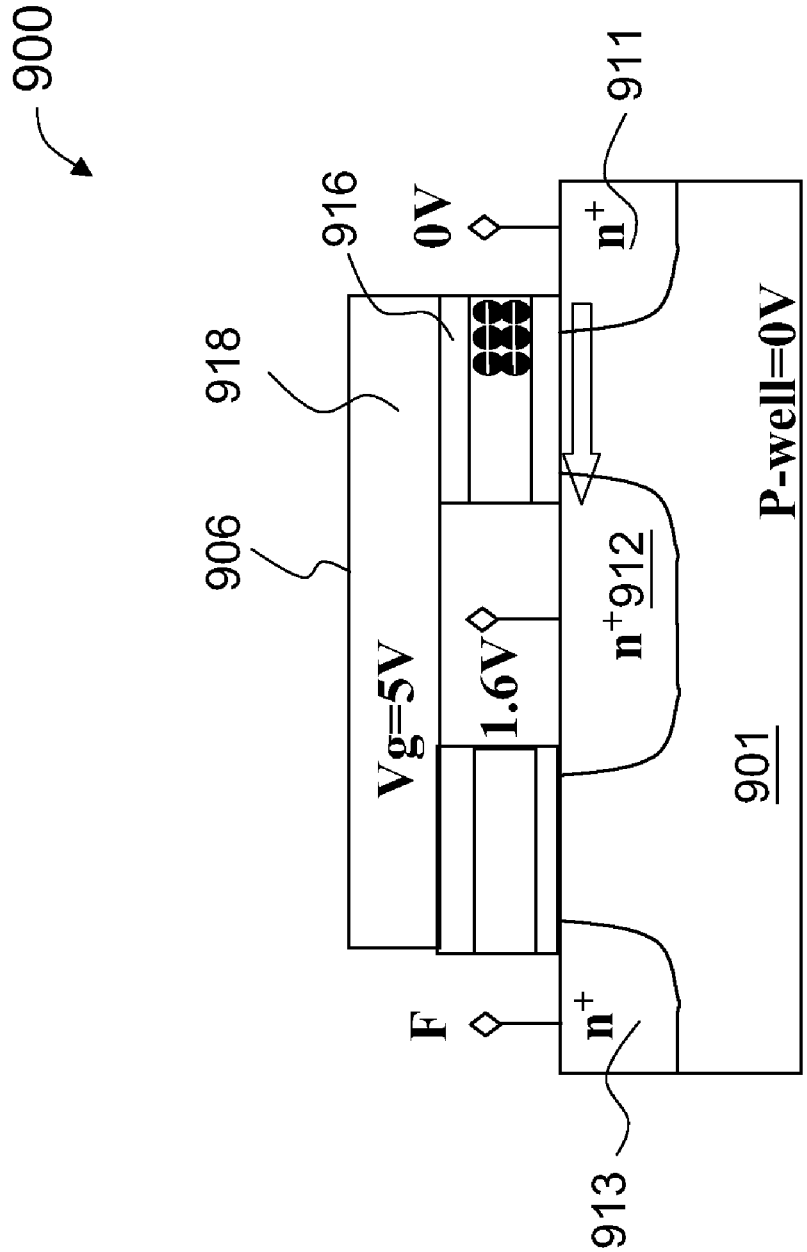
FIG. 9 is a simplified view diagram illustrating a method for reading a nitride containing nonvolatile memory cell according to an embodiment of the present invention.

FIG. 9 is a simplified view diagram illustrating a method 900 for reading a nitride containing nonvolatile memory cell (900) according to an embodiment of the present invention. This diagram is merely an example, which should not unduly limit the scope of the claims herein. One of ordinary skill in the art would recognize other variations, modifications, and alternatives. As shown, to read the nitride containing charge storage member 916 near doped region 911, the biasing condition includes maintaining a ground potential at the substrate (p-well) 901, maintaining a ground potential at the first doped region 911, applying a gate voltage, e.g. 5 V, to the first control gate 918 through word line 906, and applying a read drain voltage, e.g. 1.6 V, to the second doped region 912. The current provided at the second doped region 912 is related to injected electrons in a region of the storage member 916 close to the first doped region 911. A third doped region 913 is floating (marked by "F").

Even though the above discussion is made in the context of n-type memory cells with n-type source and drain regions, the methods provided by the invention can also be used in p-type devices. In some of the programming methods where hot electrons are used with n-type memory cells, hot holes would be used with p-type memory cells. Therefore, the term "hot carrier" will be understood to include hot electrons or hot holes. It is also noted that in the methods discussed above, a ground potential is often applied to the substrate. It is understood, however, that depending on the embodiment, another voltage could be applied. For example, a positive or negative voltage may help carrier injection or tunneling. Additionally, the memory cell operations methods discussed above are applied to nonvolatile memory arrays having different array architectures presented below according to embodiments of the invention. As noted below, in some of the operation methods, an extended channel region is provided by floating one or more doped regions between the source and drain bias terminals which receive the applied bias voltages. The electric field is reduced in the extended channel region, and punch through currents are reduced.

In embodiments of the present invention, the memory cell structures and methods associated therewith can be included in various integrated circuits. In an embodiment of the invention, an integrated circuit comprises a plurality of memory cells on a substrate and a circuit unit configured to perform various steps, including:
1. selecting a first memory cell, the selected memory cell comprising a first doped region, a second doped region, a first channel region therebetween, a first charge storage member overlying the first channel region, and a first control gate overlying the first charge storage member;
2. selecting a third doped region, the third doped region being separated from the second doped region by at least a second channel region, a second control gate overlying the second channel region; and
3. applying a bias arrangement to program the first memory cell, In a specific embodiment, the bias arrangement includes:
1. applying a substrate voltage to the substrate;
2. applying a first voltage to the first doped region;
3. applying a second voltage to the third doped region;
4. applying a third voltage to the first control gate and the second control gate; and
5. floating the second doped region.

In an embodiment of the integrated circuit, the bias arrangement turns on the first channel region and the second channel region and injects a first type of charges to the first charge storage member of the first memory cell. A specific example of this operation is channel hot electron programming. In another embodiment, the steps further comprise erasing the selected memory cell by including
1. applying a fourth voltage to the substrate;
2. applying a fifth voltage to the first control gate; and
3. applying a sixth voltage to the first doped region, whereby a second type of charges are injected to the first charge storage member to erase the first memory cell. A specific example of this operation is band-to-band tunneling of hot hole erase described above. In another embodiment, the step further comprise erasing the selected memory cell by including
1. applying a fourth voltage to the substrate; and
2. applying a fifth voltage to the first control gate, 3. whereby the first type of charges are removed from the first charge storage member.

A specific example of this operation is Fowler-Nordham erase of an NMOS cell. In yet another embodiment, the steps further comprise erasing the selected memory cell by including:
1. applying a fourth voltage to the substrate; and
2. applying a fifth voltage to the first control gate, whereby a second type of charges are injection from the substrate to the first charge storage member. A specific example of this operation is Fowler-Nordham erase of a PMOS cell.

In another embodiment of the integrated circuit, the bias arrangement injects a first type of charges to the first charge storage member of the first memory cell and is insufficient to turn on the first channel region. An example of this operation is band-to-band tunneling of hot hole programming. In a specific embodiment, the steps further comprise erasing the selected memory cell by including:
1. applying a fourth voltage to the substrate; and
2. applying a fifth voltage to the first control gate, whereby a second type of charges are injected from the first gate to the first charge storage member of the first memory. In another embodiment, the steps further comprise erasing the selected memory cell by including:
1. applying a fourth voltage to the substrate; and
2. applying a fifth voltage to the first control gate, and
3. applying a sixth voltage to one of the first doped region and the second doped region,
whereby a second type of charges are injected from the substrate to the first charge storage member of the first memory.

In another embodiment, the steps further comprise erasing the selected memory cell by including:
1. applying a fourth voltage to the substrate; and
2. applying a fifth voltage to the first control gate, and
3. applying a sixth voltage to one of the first doped region and the second doped region,
whereby the first type of charges are removed from the first charge storage member of the first memory cell.

In another embodiment of the integrated circuit, the steps further comprise:
1. selecting a second memory cell adjacent to the first memory cell, the second memory cell comprising the first doped region, a fourth doped region, a third channel region therebetween, a second charge storage member overlying the third channel region, a third control gate overlying the third channel region; and
2. applying a fourth voltage to the fourth doped region, such that the second charge storage member are free from being programmed, wherein the fourth voltage is not more than the first voltage.

An example of this operation is the programming inhibit operation describe above.

In another embodiment of the integrated circuit, the third doped region is separated from the second doped region by two or more channel regions, the bias arrangement further comprising:
1. applying the third voltage to the control gates overlying each of the two or more channel regions to turn on each of the two or more channel regions; and
2. floating the doped regions between each adjacent pair of the two or more channel regions.

In another embodiment of the integrated circuit, each of the plurality of memory cells is capable of holding multiple bits of information, the bias arrangement further comprising programming the memory cell until a threshold voltage of the memory cell is within a predetermined range of a threshold voltage target.

In another embodiment of the integrated circuit, the steps further comprise reading the selected memory cell by including
1. applying a fourth voltage to the first doped region;
2. applying a fifth voltage to the second doped region, the fifth voltage is less than the fourth voltage; and
3. applying a sixth voltage to the first control gate;
whereby a current served as an indication of the amount of injected charges at least in a portion of the first charge storage member is provided at the first doped region. An example of this operation is the forward read described above.

In another embodiment of the integrated circuit, the steps further comprise reading the selected memory cell by including:
1. applying a fourth voltage to the first doped region;
2. applying a fifth voltage to the second doped region, wherein the fourth voltage is less than the fifth voltage; and
3. applying a sixth voltage to the first control gate;
whereby a current served as an indication of the amount of injected charges at least in a portion of the first charge storage member is provided at the second doped region. An example of this operation is the reverse read described above.

According to some embodiments of the present invention, the memory cell structures and operation methods associated therewith can be used to form various memory arrays. Exemplary memory arrays and operational methods are illustrated in the examples below.

Figure 10:
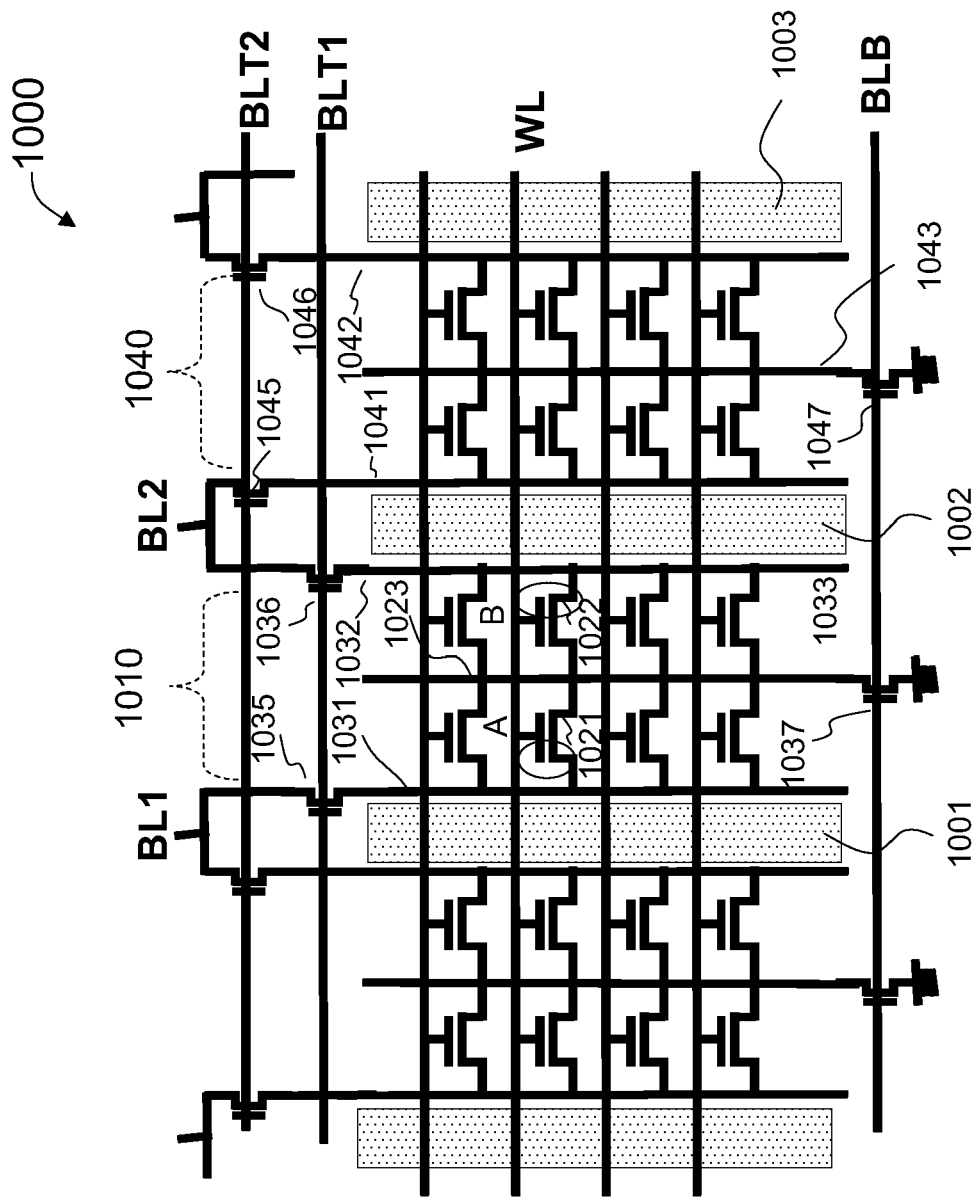
FIG. 10 is a simplified view diagram illustrating a nonvolatile memory array including isolation structures according to an embodiment of the present invention.

FIG. 10 is a simplified view diagram illustrating a nonvolatile memory array including isolation structures according to an embodiment of the present invention. This diagram is merely an example, which should not unduly limit the scope of the claims herein. One of ordinary skill in the art would recognize other variations, modifications, and alternatives. As shown, nonvolatile memory array 1000 includes a plurality of isolation regions, such as 1001 and 1002. A first plurality of nonvolatile memory cell pairs 1010 are located between a first isolation region 1001 and a second isolation region 1002. Each memory cell pair includes two adjacent cells share a common doped region. For example, in array 1000, a first memory cell A and a second memory cell B share a common doped region 1023. In FIG. 10, memory cell pair A and B includes a first doped region 1021, a second doped region 1022, and a common doped region 1023.

Depending on the embodiment, each memory cell can be one of the memory cells discussed above in connection with FIGS. 2A, 2B, and 3-9. Each of the nonvolatile memory cells may have a floating gate storage member or a nitride containing storage member. To simplify the figure, details of the memory cells are not shown in FIG. 10. For example, memory cell A includes a first channel region between the first doped region 1021 and the common doped region 1023, a first charge storage member overlying the first channel region, and a first control gate overlying the first charge storage member. Memory cell B includes a second channel region between the common doped region 1023 and the second doped region 1022, a second charge storage member overlying the second channel region, and a second control gate overlying the second charge storage member. As shown, memory cells A and B are coupled by the common doped region 1023.

In memory cell array 1000, a first bit line 1031 is coupled to a first doped region of each of the first plurality of memory cell pairs, such as a source/drain region 1021 of cell A. A second bit line 1032 is coupled to a second doped region of each of the first plurality of memory cell pairs, such as a source/drain 1022 of cell B. The doped regions are referred to as source/drain regions, because depending on the embodiment, these regions can operate as either a source terminal or a drain terminal of the MOS transistor formed by the memory cells. A first common bit line 1033 is coupled to the common doped region of each of the first plurality of memory cell pairs, such as 1023 shared by cell A and cell B. In the discussion below, the common doped region is also referred to as the third doped region in the memory cell pair. Array device 1000 also has a plurality of word lines. Each word line is coupled to a first gate and a second gate of each of the first plurality of memory cell pairs. For example, word line WL is coupled to the gate of cell A and the gate of cell B. Nonvolatile memory array 1000 also has a first select line BLT1 coupled to a first switch 1035 which is connected to the first bit line 1031. BLT1 is also coupled to a second switch 1036 coupled to the second bit line 1032.

As shown in FIG. 10, nonvolatile memory array 1000 also includes a second plurality of nonvolatile memory cell pairs 1040 located between a third isolation region 1003 and the second isolation region 1002. Each of the second plurality of memory cell pairs 1040 includes a first memory cell and a second memory cell sharing a common doped region, similar to 1010 described above. A third bit line is 1041 coupled to a first doped region of each of the second plurality of memory cell pairs 1040. A fourth bit line 1042 is coupled to a second doped region of each of the second plurality of memory cell pairs 1040. A second common bit line 1043 is coupled to the common doped region of each of the second plurality of memory cell pairs 1040. A second select line BLT2 is coupled to a third switch 1045 connected to the third bit line 1041 and to a fourth switch 1046 connected to the fourth bit line 1042.

In a specific embodiment, the nonvolatile memory array 1000 also includes a common (third) select line BLB coupled to the fifth switch 1037 which is connected to the first common bit line 1033 and coupled to a sixth switch 1047 which is connected to the second common bit line 1043. In FIG. 10, the nonvolatile memory array 1000 also includes a first global bit line BL1 coupled to the first bit line 1031 via the first switch 1035. A second global bit line BL2 is coupled to the second bit line 1032 via the second switch 1036.

Figure 11:
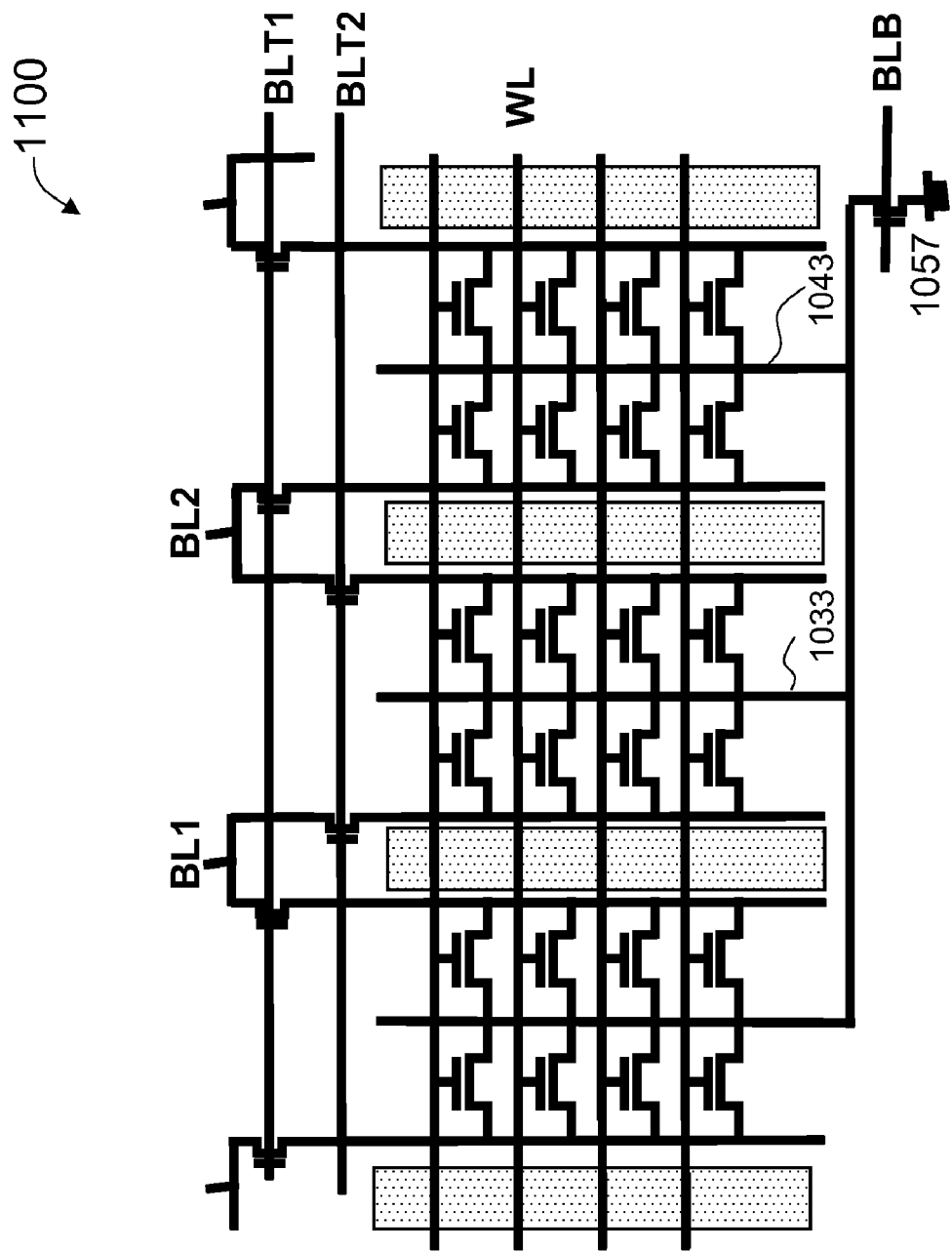
FIG. 11 is a simplified view diagram illustrating another nonvolatile memory array including isolation structures according to another embodiment of the present invention.

FIG. 11 is a simplified view diagram illustrating another nonvolatile memory array 1100 including isolation structures according to another embodiment of the present invention. Memory array 1100 is similar to memory array 1000, but has a different arrangement for the common bit lines and the common select line. As shown, a common select line BLB is coupled to a switch 1057. Switch 1057 is connected to multiple common bit lines, such as common bit line 1033 and common bit line 1043.

The memory cell operations methods discussed above in connection with FIGS. 2A, 2B, and 3-9 can be applied to nonvolatile memory arrays having different array architectures according to embodiments of the invention. As noted below, in some of the operation methods, an extended channel region is provided by floating one or more doped regions between the source and drain bias terminals which receive the applied bias voltages. The electric field is reduced in the extended channel region, and punch through currents are reduced.

Various memory array architectures and operations are now discussed below. It is noted that in the examples to follow, the memory cells can include floating gate or nitride in the charge storage member. The memory cells are connected in different arrays using bit lines and word lines. Additionally, various voltage sources are coupled to the bit lines and/or word lines through switch devices controlled by select lines. As shown below, during operation, different voltages are applied to bit lines and word lines, so that the terminals of the memory cells can be set at the potentials required for the different operations. Under some conditions, potentials of the select lines are raised or lowered to turn on or turn off the switch devices to allow the proper voltages to be applied to the memory cell terminals.

According to embodiments of the invention, each of the memory cells can be a multilevel memory cell. In other words, each memory cell is capable of holding multiple bits of information. For multilevel operation, the memory cell includes multiple threshold voltage targets. The programming method includes programming the memory cell until the threshold voltage of the memory cell is within a predetermined range of a predetermined threshold voltage target.

It is understood that in the operation methods discussed below, the memory cells operate like NMOS transistors, i.e., having n-type source/drain and a p-well. In alternative embodiments, memory cells configured like PMOS transistors can also be used, and the biased voltages will be adjusted accordingly.

It is noted that in the examples discussed below, the switch devices are NMOS transistors. Therefore, the potential on a corresponding select line coupled to the NMOS is raised to turn on the switch. Conversely, the potential on the select line is lowered to turn off the NMOS switch. It is understood that other switch device can also be used, and select line potentials are adjusted accordingly. For example, a PMOS transistor can be used as a switch. In that case, the potential of the select line is lowered to turn on the PMOS switch and raised to turn off the PMOS switch.

Accordingly, in the discussion below, "turning on" a select line is understood to mean that an appropriate voltage is applied to the select line to turn on the switch devices connected to the select line. Similarly, "turning off" a select line is understood to mean that an appropriate voltage is applied to the select line to turn off the switch devices connected to the select line.

Depending on the embodiment, the memory cells can be floating gate based nonvolatile cells or nitride based nonvolatile cells. For floating gate based cells, the cell bias conditions for operations such as programming, reading, and erasing, are similar to the methods described in connection with FIGS. 2A, 2B, and 3-5. For nitride based cells, the cell bias conditions for operations such as programming, reading, and erasing, are similar to the methods described in connection with FIGS. 2A, 2B, and 6-9. In memory array 1000, these cell bias conditions are set up by applying appropriate voltages to the word lines, global bit lines, and select lines. A specific example is listed in Table 1 and discussed in further details below.

TABLE 1

|  | BL1 | BL2 | WL | BLT2 | BLT1 | BLB | P-well | Un-selected WL |
|---|---|---|---|---|---|---|---|---|
| Program A cell (CHE) | 5 V | 0 V | 10 V | 0 V | 10 V | 0 V | 0 V | 0 V or −Vg |
| Program B cell (CHE) | 0 V | 5 V | 10 V | 0 V | 10 V | 0 V | 0 V | 0 V or −Vg |

TABLE 1-continued

|  | BL1 | BL2 | WL | BLT2 | BLT1 | BLB | P-well | Un-selected WL |
|---|---|---|---|---|---|---|---|---|
| Erase A and B BTBT HH for Nitride cell) | 5 V | 5 V | −10 V | 0 V | 10 V | 0 V | 0 V |  |
| Erase (−FN for FG cell) | F | F | −20 V | 0 V | 0 V | 0 V | 0 V |  |
| Read A cell | 0.6 V | F | 5 V | 0 V | 10 V | 10 V | 0 V | 0 V or −Vg |
| Read B cell | F | 0.6 V | 5 V | 0 V | 10 V | 10 V | 0 V | 0 V or −Vg |

According to a specific embodiment, a method for programming a cell in array 1000, e.g. cell A, can be briefly summarized below with reference to FIG. 10.

1. Apply a first voltage (e.g. 5V) to a first global bit line (BL1);
2. Apply a second voltage (e.g. 0V) to a second global bit line (BL2);
3. Turn on a first select line (e.g. apply 10V to BLT1) to couple the first global bit line (BL1) to the first doped region (1021) of the first memory cell (A) and to couple the second global bit line (BL2) to the second doped region (1022);
4. Turn off a second select line (e.g. apply 0V to BLT2) to decouple the first global bit line (BL1) and the second global bit line (BL2) from a second plurality of memory cells (1040);
5. Turn off a third select line (e.g. apply 0V to BLB) to electrically float a common bit line (1033) coupled to the third (common) doped region; and
6. Apply a third voltage (e.g. 10V) to a word line (WL) coupled to the control gate of the first memory cell A, and the second memory cell B that turn-on the channel between 1021 and 1023, and channel between 1023 and 1022.

In the method discussed above, the substrate of the memory cell array is connected to a ground potential. The bias condition in cell A and cell B includes 5V at the drain 1021, 10V at their gates through word line WL, 0V at source 1022, with doped region 1023 floating. Such bias conditions cause channel hot electrons (CHE) to be injected into a charge storage layer of memory cell A. In an embodiment, the unselected word lines are biased at 0V or at a negative gate voltage to reduce the punchthrough leakage of the unselected memory cells.

In a specific embodiment, to reduce disturb conditions in unselected cells, the programming method also includes applying a ground or negative potential to word lines not coupled to the first memory cell. In another embodiment, the memory cell is capable of holding multiple bits of information, and the programming method for multilevel operation includes programming the memory cell until a threshold voltage of the memory cell is within a predetermined range of a predetermined threshold voltage target.

In an embodiment, the first memory cell in array 1000 has a dielectric charge trapping material, e.g., a nitride based charge storage material. A method for erasing the first memory cell A but not the memory cell B can be briefly summarized below.

1. applying a fourth voltage (e.g. 5V) to the first global bit line (BL1);
2. applying a fifth voltage (e.g. 0V) to the second global bit line (BL2);
3. turning on a first select line (e.g. apply 10V to BLT1) to couple the first global bit line (BL1) to the first doped region (1021) of the first memory cell (A) and to couple the second global bit line (BL2) to the second doped region (1022);
4. turning off a third select line (e.g. apply 0V to BLB) to electrically float a common bit line (1033) coupled to the third (common) doped region; and
5. applying a sixth voltage (e.g. −10V) to the word line (WL) coupled to the control gate of the first memory cell.

In the method discussed above, the substrate of the memory cell array is connected to a ground potential. The bias condition in cell A and cell B includes 5V at the drain 1021, −10V at their gates through word line WL, 0V at source 1022, with doped region 1023 floating. Such bias conditions cause band-to-band tunneling induced hot holes (BTBT HH) to be injected into a charge storage layer of memory cell A but not into a charge storage layer of memory cell B. The electrons originally were present in the nitride charge storage material can now be neutralized, and cell A is erased.

In an embodiment, where the first and the second memory cells in array 1000 includes a dielectric charge trapping material, e.g., a nitride based charge storage material, the method for erasing the first memory cell A and the second memory cell B can be briefly summarized below.

1. applying a fourth voltage (e.g. 5V) to the first global bit line (BL1);
2. applying a fifth voltage (e.g. 5V) to the second global bit line (BL2);
3. turning on a first select line (e.g. apply 10V to BLT1) to couple the first global bit line (BL1) to the first doped region (1021) of the first memory cell (A) and to couple the second global bit line (BL2) to the second doped region (1022);
4. turning off a third select line (e.g. apply 0V to BLB) to electrically float a common bit line (1033) coupled to the third (common) doped region; and
5. applying a sixth voltage (e.g. −10V) to the word line (WL) coupled to the control gate of the first memory cell A and the second memory cell B.

In the method discussed above, the bias condition in cell A and cell B includes 5V at the drain 1021, −10V at their gates through word line WL, 5V at source 1022, with doped region 1023 floating. Such bias conditions cause band-to-band tunneling induced hot holes to be injected into a charge storage layer of memory cell A and cell B. The electrons originally were present in the nitride charge storage material can now be neutralized, and cell A cell B are erased.

In another embodiment, wherein the first memory cell of memory array 1000 includes a floating gate based charge storage layer. A method for erasing the first memory cell can be briefly summarized below.

1. floating the first global bit line (BL1);
2. floating the second global bit line (BL2);
3. turning off the first select line (BLT1) to decouple the first global bit line to electrically float the first doped region (1021) of the first memory cell and to decouple the second global bit line to electrically float the second doped region (1022);
4. turning off the third select line (BLB) to electrically float a common bit line coupled to the third doped region (1023);
5. applying a seventh voltage to the word line (WL) coupled to the control gate of the first memory cell; and
6. applying an eight voltage (0V) to the substrate;

In the method discussed above, the substrate of the memory cell array is connected to a ground potential. Cell A is biased at −20V at its gate through word line WL, and the substrate is at 0V. Such bias conditions cause electrons to be removed from the floating gate charge storage layer of the first memory cell by Fowler-Nordheim (FN) tunneling. Cell A can then be erased.

In yet another embodiment, a method of reading the first memory cell A in array 1000 can be briefly summarized below.
1. applying a ninth voltage (e.g. 0.6V) to the first global bit line;
2. floating the second global bit line;
3. turning off a second select line (BLT2) to decouple the first global bit line and the second global bit line from a second plurality of memory cells;
4. turning on a first select line (BLT1) to couple the first global bit line to the first doped drain of the first memory cell and to couple the second global bit line to the second doped region;
5. turning on the third select line (BLB) to electrically ground (e.g. apply 0V to) a common bit line coupled to the third doped region; and
6. applying a tenth voltage (e.g. 5V) to the word line coupled to the control gate of the first memory cell A.

The substrate of the memory cell array is connected to a ground potential. Under these bias conditions, a current provided at the first global bit line is associated with a threshold voltage of the first memory cell.

In the method discussed above, cell A is biased at 5V at its gate through word line WL, 0.6V at its drain 1021, and 0V at its source 1023. Under such bias conditions, a current provided at the first bit line is associated with a threshold voltage of cell A. By measure the current present in bit line 1031, cell A can be read.

It is noted that methods for programming and reading cell A in array 1000 are discusses in detail above. Similar method can be used to program or read cell B in array 1000, by reversing the bias voltages on BL1 and BL2, as shown in Table 1 above.

In an alternative embodiment of the invention, arrays 1000 and 1100 can be implemented using memory cells that are operated by band-to-band hot hole program to low Vt and FN tunneling erase to high Vt. Table 1A below summaries the various bias conditions. The detailed operations are similar to the discussion above in connection with Table 1.

TABLE 1A

|  | BL1 | BL2 | WL | BLT2 | BLT1 | BLB | P-well | Un-selected WL |
|---|---|---|---|---|---|---|---|---|
| Program A cell | 5 V | 0 V | −5 V | 0 V | 10 V | 0 V | 0 V | 0 V or −Vg |
| Program B cell | 0 V | 5 V | −5 V | 0 V | 10 V | 0 V | 0 V | 0 V or −Vg |
| Erase (−FN All) for SiN | F | F | −20 V | 0 V | 0 V | 0 V | 0 V | −20 V |
| Erase (+FN All) for FG | 0 V | 0 V | 20 V | 10 V | 10 V | 10 V | 0 V | 20 V |
| Read A cell | 0.6 V | F | 5 V | 0 V | 10 V | 10 V | 0 V | 0 V or −Vg |
| Read B cell | F | 0.6 V | 5 V | 0 V | 10 V | 10 V | 0 V | 0 V or −Vg |

Figure 12:
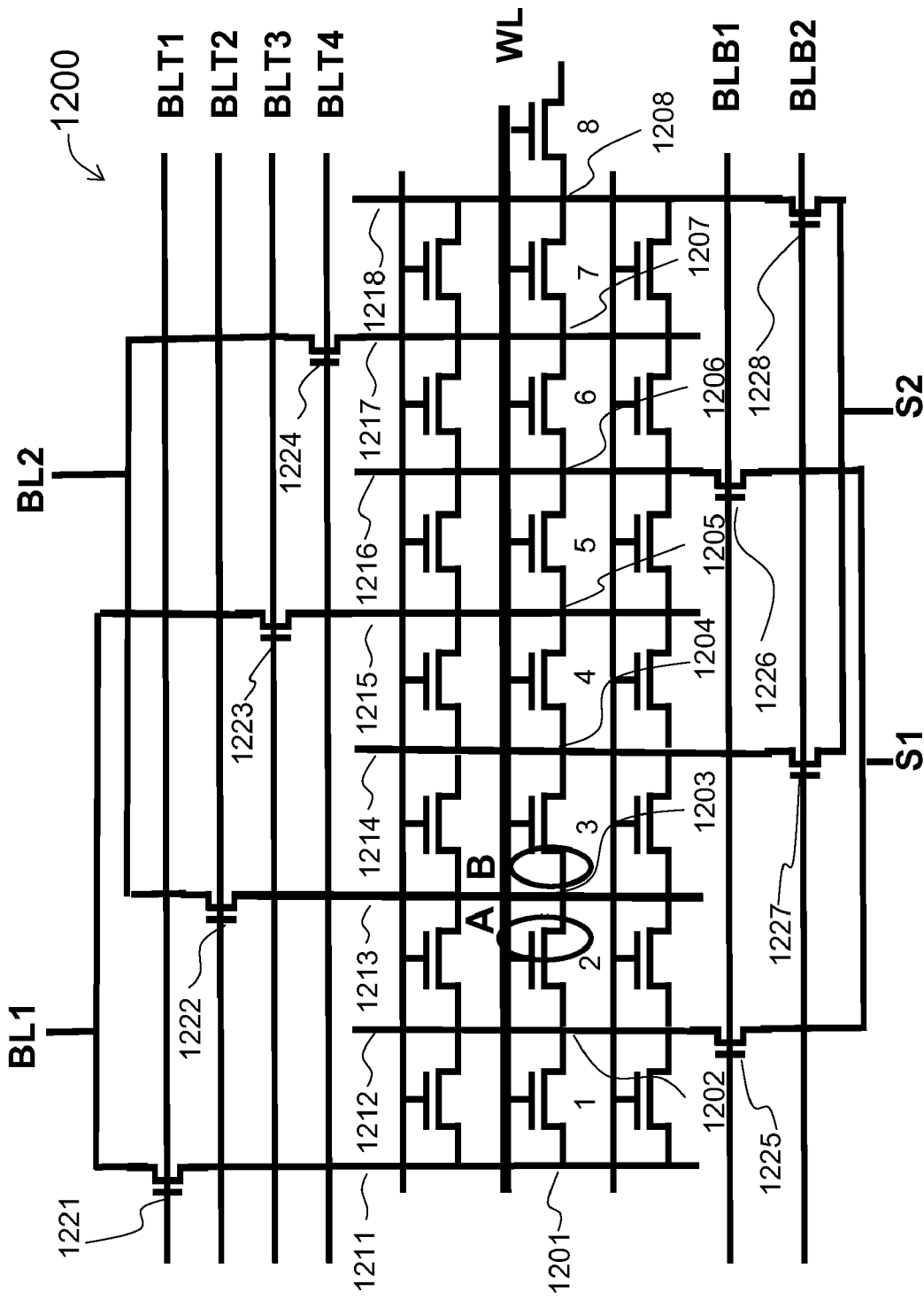
FIG. 12 is a simplified view diagram illustrating a virtual ground nonvolatile memory array according to an embodiment of the present invention.

FIG. 12 is a simplified view diagram illustrating a virtual ground nonvolatile memory array 1200 according to an embodiment of the present invention. As shown, memory array 1200 includes a plurality of nonvolatile memory cells arranged in rows and columns. Each of plurality of word lines are coupled to memory cells in a row. A first word line (WL) is coupled to eight memory cells, each of the memory cells designated as the Nth memory cell, where N=1 to 8. Each memory cell has two doped regions and a channel regions therebetween. In FIG. 12, the memory cells are shown as 1, 2, . . . , 8, and the doped regions are shown as 1201, 1202, . . . , 1208. Each pair of adjacent memory cells are coupled by a common doped region. For example, cell 2 has doped regions 1202 and 1203, and cell 3 has doped regions 1203 and 1204. Cell 2 and cell 3 are coupled by the common doped regions 1203. Depending on the embodiment, each doped region can function either as a drain region or a source region during a cell operation. Further, each memory cell has a charge storage material (not shown) which can be floating gate based charge storage material discussed above in conjunction with FIGS. 3-5, a dielectric charge trapping material, e.g., nitride based charge storage material discussed above in conjunction with FIGS. 6-9, or other types of charge storage material.

Memory array 1200 also includes a plurality of bit lines 1211-1218, each bit line designated as the Nth bit line, where N=1 to 8. The Nth bit line is coupled to a doped region shared by the Nth memory cell and an adjacent memory cell. For example, bit line 1212 is the second bit line, which is coupled to doped region 1202 shared between cell 1 and cell 2.

Memory array 1200 also includes four global bit lines which are coupled to eight bit lines through switches controlled by select lines. As shown, a first global bit line (BL1) is coupled to the first bit line 1211 and the fifth bit line 1215. A second global bit line (BL2) is coupled to the third bit line 1213 and the seventh bit line 1217. A third global bit line S1 is coupled to the second bit line 1212 and the sixth bit line 1216. A fourth global bit line S2 is coupled to the fourth bit line 1214 and the eighth bit line 1218.

In memory array 1200, six select lines and eight switches are provided for coupling the global bit lines and the local bit lines 1211-1218. A first select line BLT1 couples the first global bit line BL1 to the first bit line 1211 via a first switch 1221. Similarly, a second select line BLT2 couples the second global bit line BL2 to the third bit line 1213 via a second switch 1222. A third select line BLT3 couples the first global bit line BL1 to the fifth bit line 1215 via a third switch 1223. A fourth select line BLT4 couples the second global bit line BL2 to the seventh bit line 1217 via a fourth switch 1224. A fifth select line BLB1 coupling the third global bit line S1 to the second bit line 1212 via a fifth switch 1225. The fifth select line BLB1 also couples the third global bit line S1 to the sixth bit line 1216 via a sixth switch 1226. Additionally, a sixth select line BLB2 couples the fourth global bit line S2 to the fourth bit line 1214 via a seventh switch 1227. The sixth select line BLB2 also couples the fourth global bit line S2 to the eighth bit line 1218 via an eighth switch 1228.

Depending on the embodiment, the memory cells can be floating gate based nonvolatile cells or nitride based nonvolatile cells. For floating gate based cells, the cell bias conditions for operations such as programming, reading, and erasing, are similar to the methods described in connection with FIGS. 2A, 2B, and 3-5. For nitride based cells, the cell bias conditions for operations such as programming, reading, and erasing, are similar to the methods described in connection with FIGS. 2A, 2B, and 6-9.

In memory array 1200, these cell bias conditions are set up by applying appropriate voltages to the word lines, global bit lines, and select lines. A specific example is listed in Table 2 and discussed in further details below.

TABLE 2

| | BL1 | BL2 | S1 | S2 | WL | BLT1 | BLT2 | BLT3 | BLT4 | BLB1 | BLB2 | P-well | Un-selected WL |
|---|---|---|---|---|---|---|---|---|---|---|---|---|---|
| Program cellA (CHE) | 0 V | 5 V | 0 V | 0 V | 10 V | 10 V | 10 V | 0 V | 0 V | 0 V | 0 V | 0 V | 0 V or −Vg |
| Erase (BTBT HH for nitride cell) | 0 V | 5 V | 0 V | 0 V | −10 V | 10 V | 10 V | 0 V | 0 V | 0 V | 0 V | 0 V | |
| Erase (−FN for FG cell) | F | F | F | F | −20 V | 0 V | 0 V | 0 V | 0 V | 0 V | 0 V | 0 V | |
| Read cellA | F | 0.6 V | 0 V | 0 V | 5 V | 0 V | 10 V | 0 V | 0 V | 10 V | 0 V | 0 V | 0 V or −Vg |

According to embodiments of the invention, various operation methods are provided for memory array 1200. A method of programming a memory cell can be briefly summarized below.

1. selecting a first nonvolatile memory cell (e.g. cell 2, marked as cell A) and a second memory cell (e.g. cell 1) from the plurality of nonvolatile memory cells in array 1200. The first memory cell (cell 2) includes a first doped region 1203, a second doped region 1202, and a channel region therebetween. The second memory cell (cell 1) includes the second doped region 1202 and a third doped region 1201;
2. applying a first voltage (e.g. 0V) to a first global bit line (BL1);
3. applying a second voltage (e.g. 5V) to a second global bit line (BL2);
4. applying a ground voltage (e.g. 0V) to a third global bit line and a fourth global bit line;
5. turning on a first select line BLT1 coupled to a first bit line switch 1221 to couple the first global bit line BL1 to the third doped region 1201;
6. turning on a second select line BLT2 coupled to a second bit line switch 1222 to couple the second global bit line BL2 to the first doped region 1203;
7. turning off a third select line BLT3 coupled to a third bit line switch 1223 to decouple the first global bit line BL1 from a fifth bit line;
8. turning off a fourth select line BLT4 coupled to a fourth bit line switch 1224 to decouple the second global bit line BL2 from a seventh bit line;
9. turning off a fifth select line BLB1 coupled to a fifth bit line switch (1225) to electrically decouple the third global bit line S1 from the second doped region 1202 of the first memory cell and to electrically float the second doped region, the third global bit line is also decoupled from the sixth bit line;
10. turning off a sixth select line BLB2 to electrically decouple the fourth global bit line from a fourth bit line and an eighth bit line; and
11. applying a third voltage (e.g. 10V) to a word line (WL) coupled to the control gates of the memory cell 2 and memory cell 1.

In the method discussed above, the substrate of the memory cell array is connected to a ground potential. 10V is applied at the gates of cell 2 and cell 1, 5V at drain 1203 of cell 2, doped region 1022 is floating, the channels of cell 2 and cell 1 are turned on, and the source 1201 of cell 1 is at 0V. Under such bias conditions, channel hot electrons (CHE) are injected into a charge storage layer oft memory cell 2 to program cell 2.

In an embodiment, where the first memory cell in array 1200 includes a dielectric charge trapping material, e.g., a nitride based charge storage material, the method for erasing the first memory cell can be briefly summarized below.

1. selecting a first nonvolatile memory cell (e.g. cell 2) and a second memory cell (e.g. cell 1) from the plurality of nonvolatile memory cells 1200. Memory cell 2 includes a first doped region 1203, a second doped region 1202, and a channel region therebetween. The second memory cell (cell 1) includes the second doped region 1202 and a third doped region 1201;
2. applying a first voltage (e.g. 0V) to a first global bit line (BL1);
3. applying a second voltage (e.g. 5V) to a second global bit line (BL2);
4. applying a ground voltage (e.g. 0V) to a third global bit line and a fourth global bit line;
5. turning on a first select line BLT1 coupled to a first bit line switch 1221 to couple the first global bit line BL1 to the third doped region 1201;
6. turning on a second select line BLT2 coupled to a second bit line switch 1222 to couple the second global bit line BL2 to the first doped region 1203;
7. turning off a third select line BLT3 coupled to a third bit line switch 1223 to decouple the first global bit line BL1 from a fifth bit line;
8. turning off a fourth select line BLT4 coupled to a fourth bit line switch 1224 to decouple the second global bit line BL2 from a seventh bit line;
9. turning off a fifth select line BLB1 coupled to a fifth bit line switch (1225) to electrically decouple the third global bit line S1 from the second doped region of the first memory cell and to electrically float the second doped region, the third global bit line is also decoupled from the sixth bit line;
10. turning off a sixth select line BLB2 to electrically decouple the fourth global bit line S2 from a fourth bit line and an eighth bit line; and 11. applying a third voltage (e.g. −10V) to a word line (WL) coupled to the control gates of the memory cell 2.

The substrate of the memory cell array is connected to a ground potential. Under these bias conditions, charged carriers are injected into a charge storage layer of the first memory cell by band-to-band tunneling induced hot hole injection (BTBT HH). The first memory cell (cell 2) is erased.

In an embodiment, where the first memory cell in array 1200 includes a floating gate charge storage material, the method for erasing the first memory cell can be briefly summarized below.

1. selecting a first nonvolatile memory cell (e.g. cell 2) and a second memory cell (e.g. cell 2) from the plurality of nonvolatile memory cells 1200. Memory cell 2 including a first doped region 1203, a second doped region 1202, and a channel region therebetween. The second memory cell (cell 2) includes the second doped region 1202 and a third doped region 1201);
2. floating a first global bit line (BL1);
3. floating a second global bit line (BL2);
4. floating a third global bit line and a fourth global bit line;
5. turning off a first select line BLT1 coupled to a first bit line switch 1221 to decouple the first global bit line BL1 from the third doped region 1201;
6. turning off a second select line BLT2 coupled to a second bit line switch 1222 to decouple the second global bit line BL2 from the first doped region 1203;
7. turning off a third select line BLT3 coupled to a third bit line switch 1223 to decouple the first global bit line BL1 from a fifth bit line;
8. turning off a fourth select line BLT4 coupled to a fourth bit line switch 1224 to decouple the second global bit line BL2 from a seventh bit line;
9. turning off a fifth select line BLB1 coupled to a fifth bit line switch 1225 to electrically decouple the third global bit line S1 from the second doped region of the first memory cell and to electrically float the second doped region, the third global bit line is also decoupled from the sixth bit line;
10. turning off a sixth select line BLB2 to electrically decouple the fourth global bit line from a fourth bit line and an eighth bit line;
11. applying a voltage (e.g. −20V) to a word line (WL) coupled to the control gates of the memory cell 2; and
12. applying a voltage (e.g. 0V) to the substrate;

Under such bias conditions, charged carriers are removed from floating gate by Fowler-Nordheim (FN) tunneling, thus erase the first memory cell.

In an embodiment, where the first memory cell in array 1200 includes a dielectric charge trapping material, e.g., a nitride based charge storage material, the method for read the first memory cell can be briefly summarized below.

1. selecting a first nonvolatile memory cell (e.g. cell 2). Memory cell 2 including a first doped region 1203, a second doped region 1202, and a channel region therebetween;
2. floating a first global bit line (BL1);
3. applying a first voltage (e.g. 0.6V) to a second global bit line (BL2);
4. applying a ground voltage (e.g. 0V) to a third global bit line and a fourth global bit line;
5. turning off a first select line BLT1 coupled to a first bit line switch 1221 to decouple the first global bit line BL1 from the third doped region 1201;
6. turning on a second select line BLT2 coupled to a second bit line switch 1222 to couple the second global bit line BL2 to the first doped region 1203;
7. turning off a third select line BLT3 coupled to a third bit line switch 1223 to decouple the first global bit line BL1 from a fifth bit line;
8. turning off a fourth select line BLT4 coupled to a fourth bit line switch 1224 to decouple the second global bit line BL2 from a seventh bit line;
9. turning on a fifth select line BLB1 coupled to a fifth bit line switch 1225 to electrically couple the third global bit line S1 to the second doped region of the first memory cell, the fifth global bit line is also coupled to the sixth bit line;
10. turning off a sixth select line BLB2 to electrically decouple the fourth global bit line from a fourth bit line and an eighth bit line; and
11. applying a second voltage (e.g. 5V) to a word line (WL) coupled to the control gates of the memory cell 2.

The substrate of the memory cell array is connected to a ground potential. Under such bias conditions, a current provided at the second global bit line is associated with a threshold voltage of the first memory cell 2.

In an alternative embodiment of the invention, array 1200 can be implemented using memory cells that are operated by band-to-band hot hole program to low Vt and FN tunneling erase to high Vt. Table 2A below summaries the various bias conditions. The detailed operations are similar to the discussion above in connection with Table 2.

TABLE 2A

| | BL1 | BL2 | S1 | S2 | WL | BLT1 | BLT2 | BLT3 | BLT4 | BLB1 | BLB2 | P-well | Un-selected WL |
|---|---|---|---|---|---|---|---|---|---|---|---|---|---|
| Program cell A/ inhibit cell B | 0 V | 5 V | 0 V | 3 V | −5 V | 10 V | 10 V | 0 V | 0 V | 0 V | 10 V | 0 V | 0 V or −Vg |
| Erase (−FN All) for SiN | F | F | F | F | −20 V | 0 V | 0 V | 0 V | 0 V | 0 V | 0 V | 0 V | −20 V |
| Erase (+FN All) for FG | 0 V | 0 V | 0 V | 0 V | 20 V | 10 V | 10 V | 10 V | 10 V | 10 V | 10 V | 0 V | +20 V |
| Read cell A | F | 0.6 V | 0 V | 0 V | 5 V | 0 V | 10 V | 0 V | 0 V | 10 V | 0 V | 0 V | 0 V or −Vg |

Figure 13:
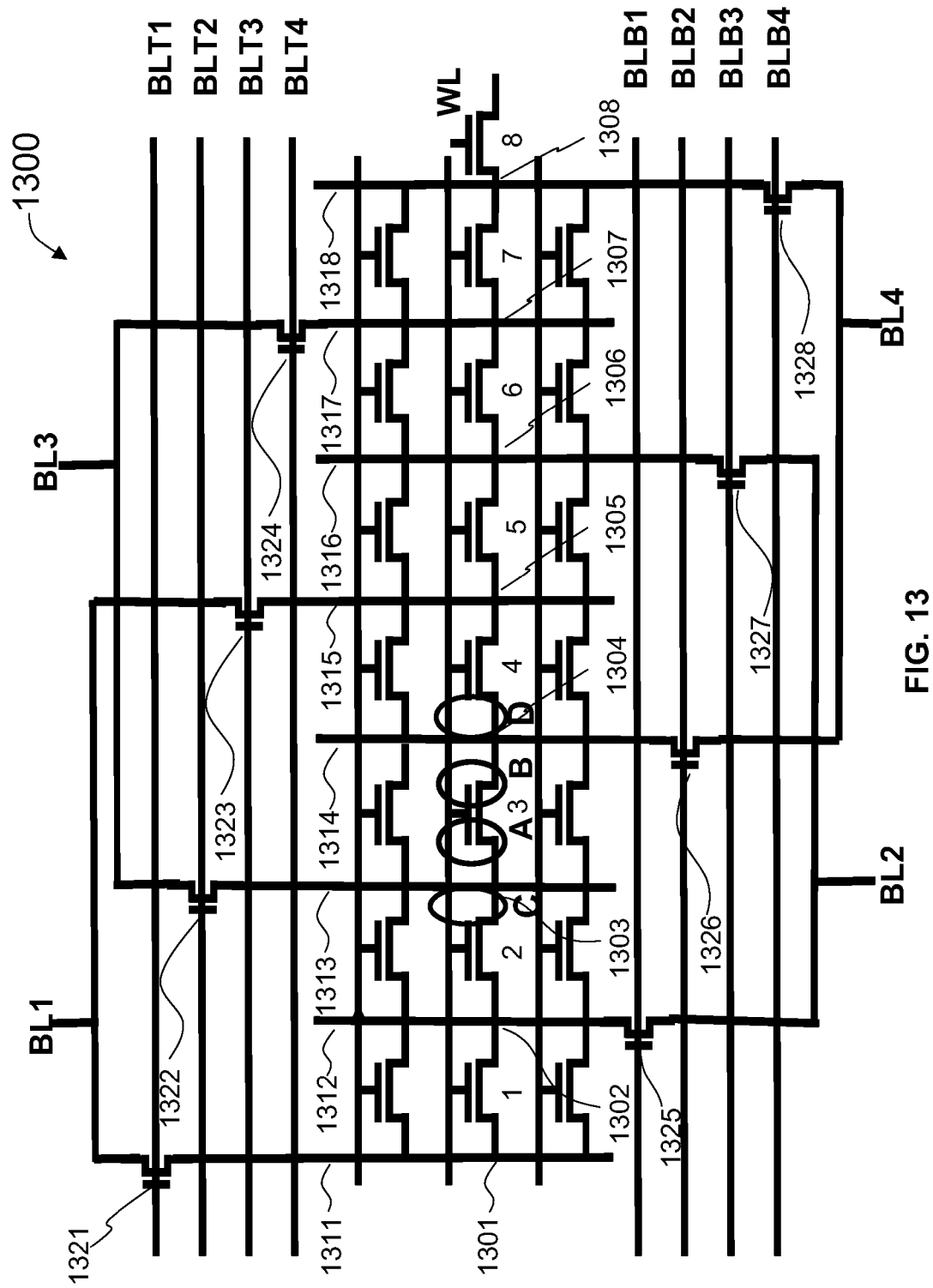
FIG. 13 is a simplified view diagram illustrating another virtual ground nonvolatile memory array according to an alternative embodiment of the present invention.

FIG. 13 is a simplified view diagram illustrating another virtual ground nonvolatile memory array 1300 according to an alternative embodiment of the present invention. This diagram is merely an example, which should not unduly limit the scope of the claims herein. One of ordinary skill in the art would recognize other variations, modifications, and alternatives. As shown, memory array 1300 includes a plurality of nonvolatile memory cells arranged in rows and columns. Each of plurality of word lines are coupled to memory cells in a row. A first word line (WL) is coupled to eight memory cells, each of the memory cells designated as the Nth memory cell, where N=1 to 8. Each memory cell has two doped regions and a channel regions therebetween. In FIG. 13, the memory cells are shown as 1, 2, . . . , 8, and the doped regions are shown as 1301, 1302, . . . , 1308. Each pair of adjacent memory cells sharing a common doped region. For example, cell 3 has doped regions 1303 and 1304, and cell 3 and cell 4 share the common doped regions 1304. Depending on the embodiment, each doped region can function either as a drain region or a source region during a cell operation. Further, each memory cell has a charge storage material (not shown) which can be floating gate based charge storage material discussed above in conjunction with FIGS. 3-5, a dielectric charge trapping material, e.g., nitride based charge storage material discussed above in conjunction with FIGS. 6-9, or other types of charge storage material.

Memory array 1300 also includes a plurality of bit lines 1311-1318, each bit line designated as the Nth bit line, where N=1 to 8. The Nth bit line is coupled to a doped region shared by the Nth memory cell and an adjacent memory cell. For example, bit line 1312 is the second bit line, which is coupled to doped region 1302 shared between cell 1 and cell 2.

Memory array 1300 also includes four global bit lines which are coupled to eight bit lines through switches controlled by select lines. A first global bit line (BL1) is coupled to the first bit line 1311 and the fifth bit line 1315. A third global bit line (BL3) is coupled to the third bit line 1313 and the seventh bit line 1317. A second global bit line BL2 is coupled to the second bit line 1312 and the sixth bit line 1316. A fourth global bit line BL4 is coupled to the fourth bit line 1314 and the eighth bit line 1318.

In memory array 1300, eight select lines and eight select switches are provided for coupling the global bit lines and the local bit lines 1311-1318. A first select line BLT1 couples the first global bit line BL1 to the first bit line 1311 via a first switch 1321. Similarly, a second select line BLT2 couples the third global bit line BL3 to the third bit line 1313 via a line switch 1322. A third select line BLT3 couples the first global bit line BL1 to the fifth bit line 1315 via a third switch 1323. A fourth select line BLT4 couples the third global bit line BL3 to the seventh bit line 1317 via a fourth switch 1324. A fifth select line BLB1 coupling the second global bit line BL2 to the second bit line 1312 via a fifth switch 1325. The sixth select line BLB2 couples the fourth global bit line BL4 to the fourth bit line 1314 via a sixth switch 1326. A seventh select line BLB3 couples the second global bit line BL2 to the sixth bit line 1316 via a seventh switch 1327. Additionally, an eighth select line BLB4 couples the fourth global bit line BL4 to the eighth bit line 1318 via an eighth switch 1328.

Depending on the embodiment, the memory cells can be floating gate based nonvolatile cells or nitride based nonvolatile cells. For floating gate based cells, the cell bias conditions for operations such as programming, reading, and erasing, are similar to the methods described in connection with FIGS. 2A, 2B, and 3-5. For nitride based cells, the cell bias conditions for operations such as programming, reading, and erasing, are similar to the methods described in connection with FIGS. 2A, 2B, and 6-9. In memory array 1300, these cell bias conditions are set up by applying appropriate voltages to the word lines, global bit lines, and select lines. A specific example is listed in Table 3 and discussed in further details below.

TABLE 3

|  | BL1 | BL2 | BL3 | BL4 | WL | P-well | Un-selected WL |
|---|---|---|---|---|---|---|---|
| Program BitA (CHE) | 0 V | F | 5 V | F | 10 V | 0 V | 0 V or −Vg |
| Program BitB (CHE) | F | 0 V | F | 5 V | 10 V | 0 V | 0 V or −Vg |
| Erase (BTBT HH for Nitride cell)) | 5 V | 5 V | 5 V | 5 V | −10 V | 0 V |  |
| Erase (−FN for FG cell) | F | F | F | F | −20 V | 0 V |  |
| Read BitA (reverse read) | F | F | 0 V | 1.6 V | 5 V | 0 V | 0 V or −Vg |
| Read BitB (reverse read) | F | F | 1.6 V | 0 V | 5 V | 0 V | 0 V or −Vg |

|  | BLT1 | BLT2 | BLT3 | BLT4 | BLB1 | BLB2 | BLB3 | BLB4 |
|---|---|---|---|---|---|---|---|---|
| Program BitA | 0 V | 10 V | 10 V | 0 V | 0 V | 0 V | 0 V | 0 V |
| Program BitB | 0 V | 0 V | 0 V | 0 V | 10 V | 10 V | 0 V | 0 V |
| Erase (BTBT HH for Nitride cell)) | 10 V | 10 V | 10 V | 10 V | 10 V | 10 V | 10 V | 10 V |
| Erase (−FN for FG cell) | 0 V | 0 V | 0 V | 0 V | 0 V | 0 V | 0 V | 0 V |
| Read BitA (reverse read) | 0 V | 10 V | 0 V | 0 V | 0 V | 10 V | 0 V | 0 V |
| Read BitB (reverse read) | 0 V | 10 V | 0 V | 0 V | 0 V | 10 V | 0 V | 0 V |

In an embodiment, each memory cell in array 1300 includes a dielectric charge trapping material, e.g., a nitride based charge storage material and two bit of information can be programmed into the memory cell. This is indicated in FIG. 13 as A and B in cell 3. Using bit A of cell 3 as an example, method of programming a memory cell can be briefly summarized below.

1. selecting a second memory cell (cell 4), the second memory cell including the second doped region 1304 and a third doped region 1305. Cell 4 includes a second channel region between the second doped region and the third doped region.
2. applying a first voltage (e.g. 0V) to a first global bit line BL1;
3. floating a second global bit line BL2;
4. applying a second voltage (e.g. 5V) to a third global bit line BL3;
5. floating a fourth global bit line BL4;
6. applying a third voltage to a word line WL coupled to a control gate of the first memory cell (cell 3) and the second memory cell (cell 4) that turn on both the first cell (cell 3) and the second cell (cell 4)
7. turning off a first select line BLT1 to decouple the first global bit line BL1 from a first bit line 1311;
8. turning on a second select line BLT2 to couple the third global bit line to the first doped region 1303;
9. turning on a third select line BLT3 to couple the first global bit line BL1 to the third doped region 1305;
10. turning off a fourth select line BLT4 to decouple the third global bit line from a seventh bit line;

11. turning off a fifth select line BLB1 to decouple the second global bit line BL2 from a second bit line;
12. turning off a sixth select line BLB2 to decouple the fourth global bit line BL4 from a fourth bit line 1314;
13. turning off a seventh select line BLB3 to decouple the second global bit line BL2 from a sixth bit line 1316; and
14. turning off an eighth select line BLB4 to decouple the fourth global bit line BL4 from a eighth bit line 1318.

In the method discussed above, cell 3 receives bias voltages similar to described in the programming method discussed above in connection with FIG. 6, and unselected memory cells are biased to reduce punch through current, similar to described in FIG. 7. In this particular example, the first doped region 1303 is coupled to 5V, the second doped region 1304 is floating, the third doped region 1305 is coupled to 0V, the control gates of cell 3 and cell 4 are coupled to 10V. Under these bias conditions, channel hot electrons (CHE) are injected into the first charge storage region A of memory cell 3.

In another example, bit B of cell 3 can be programmed using a similar method. As shown in Table 3. To program bit B of cell 3, BL1 and BL3 are floating, 0V is applied to BL2, 5V is applied to BL4, and 10V is applied to WL. Additionally, select lines BLB1 and BLB2 are turned on, and the other select lines are turned off.

In an embodiment, where each memory cell in array 1300 includes a dielectric charge trapping material, e.g., a nitride based charge storage material, the method for erasing each memory cell on the selected wordline can be briefly summarized below.
1. applying a fourth voltage to the selected word line coupled to a control gate of each memory cell on the wordline;
2. applying a fifth voltage to the substrate;
3. applying a sixth voltage to the first, the second, the third, and the fourth global bit lines; and
4. turning on the first through the eighth select lines to couple the sixth voltage to doped regions in each of the memory cells, Under these bias conditions, charged carriers are injected into a charge storage layer of each memory cell by band-to-band tunneling induced hot hole (BTBT HH) injection to erase each memory cell.

In an embodiment, where the first memory cell in array 1300 includes a floating gate charge storage material, the method for erasing the first memory cell can be briefly summarized below.
1. applying a seventh voltage to the word line coupled to a control gate of the first memory cell;
2. applying an eighth voltage to the substrate;
3. floating the first, the second, the third, and the fourth global bit lines; and
4. turning off the first through the eighth select lines to decouple first through the fourth global bit lines from the first through the eighth bit lines, respectively, and to float the doped regions in each of the memory cells.

Under these bias conditions, charged carriers are removed from the floating gate by Fowler-Nordheim (FN) tunneling to erase the first memory cell.

In an embodiment, where the first memory cell in array 1200 includes a dielectric charge trapping material, e.g., a nitride based charge storage material, the method for read the first memory cell can be briefly summarized below.
1. applying a ninth voltage to the third global bit line;
2. applying a tenth voltage to the fourth global bit line;
3. floating the first and the second global bit lines;
4. turning on the second select line couple the third global bit line to the third bit line and to couple the ninth voltage the first doped region;
5. turning on the sixth select line to couple the fourth global bit line to the fourth bit line and to couple the tenth voltage to the second doped region;
6. applying an eleventh voltage to the word line coupled to a control gate of the first memory cell;
7. turning off the first, the third, the fourth, the fifth, the seventh, and the eighth select lines.

Under the bias conditions described above and Table 3, memory cell 3 receives 1.6V at its drain 1304, 5V at its gate, and a ground potential at its source 1303. Under such bias conditions, a current provided at bit line 1314 is an indication of a threshold voltage of bit A. It is noted that bit B can be read following a similar method, with 1.6V on BL3 and 0V on BL4.

In an alternative embodiment of the invention, array 1300 can be implemented using memory cells that are operated by band-to-band hot hole program to low Vt and FN tunneling erase to high Vt. Table 3A below summaries the various bias conditions. The detailed operations are similar to the discussion above in connection with Table 3.

TABLE 3A

|  | BL1 | BL2 | BL3 | BL4 | WL | P-well | Un-selected WL |
|---|---|---|---|---|---|---|---|
| Program BitA/inhibit C | 0 V | 3 V | 5 V | F | −5 V | 0 V | 0 V or −Vg |
| Program BitB/inhibit D | 3 V | 0 V | F | 5 V | −5 V | 0 V | 0 V or −Vg |
| Erase (−FN) for SiN cell | F | F | F | F | −20 V | 0 V | −20 V |
| Erase (+FN) for FG | 0 V | 0 V | 0 V | 0 V | +20 V | 0 V | 20 V |
| Read BitA | F | F | 0 V | 1.6 V | 5 V | 0 V | 0 V or −Vg |
| Read BitB | F | F | 1.6 V | 0 V | 5 V | 0 V | 0 V or −Vg |

|  | BLT1 | BLT2 | BLT3 | BLT4 | BLB1 | BLB2 | BLB3 | BLB4 |
|---|---|---|---|---|---|---|---|---|
| Program BitA | 0 V | 10 V | 10 V | 0 V | 10 V | 0 V | 0 V | 0 V |
| Program BitB | 0 V | 0 V | 10 V | 0 V | 10 V | 10 V | 0 V | 0 V |
| Erase (−FN) for SiN cell | 0 V | 0 V | 0 V | 0 V | 0 V | 0 V | 0 V | 0 V |
| Erase (+FN) for | 10 V | 10 V | 10 V | 10 V | 10 V | 10 V | 10 V | 10 V |

TABLE 3A-continued

| FG cell | | | | | | | | |
|---|---|---|---|---|---|---|---|---|
| Read BitA (reverse read) | 0 V | 10 V | 0 V | 0 V | 0 V | 10 V | 0 V | 0 V |
| Read BitB (reverse read) | 0 V | 10 V | 0 V | 0 V | 0 V | 10 V | 0 V | 0 V |

Figure 14:
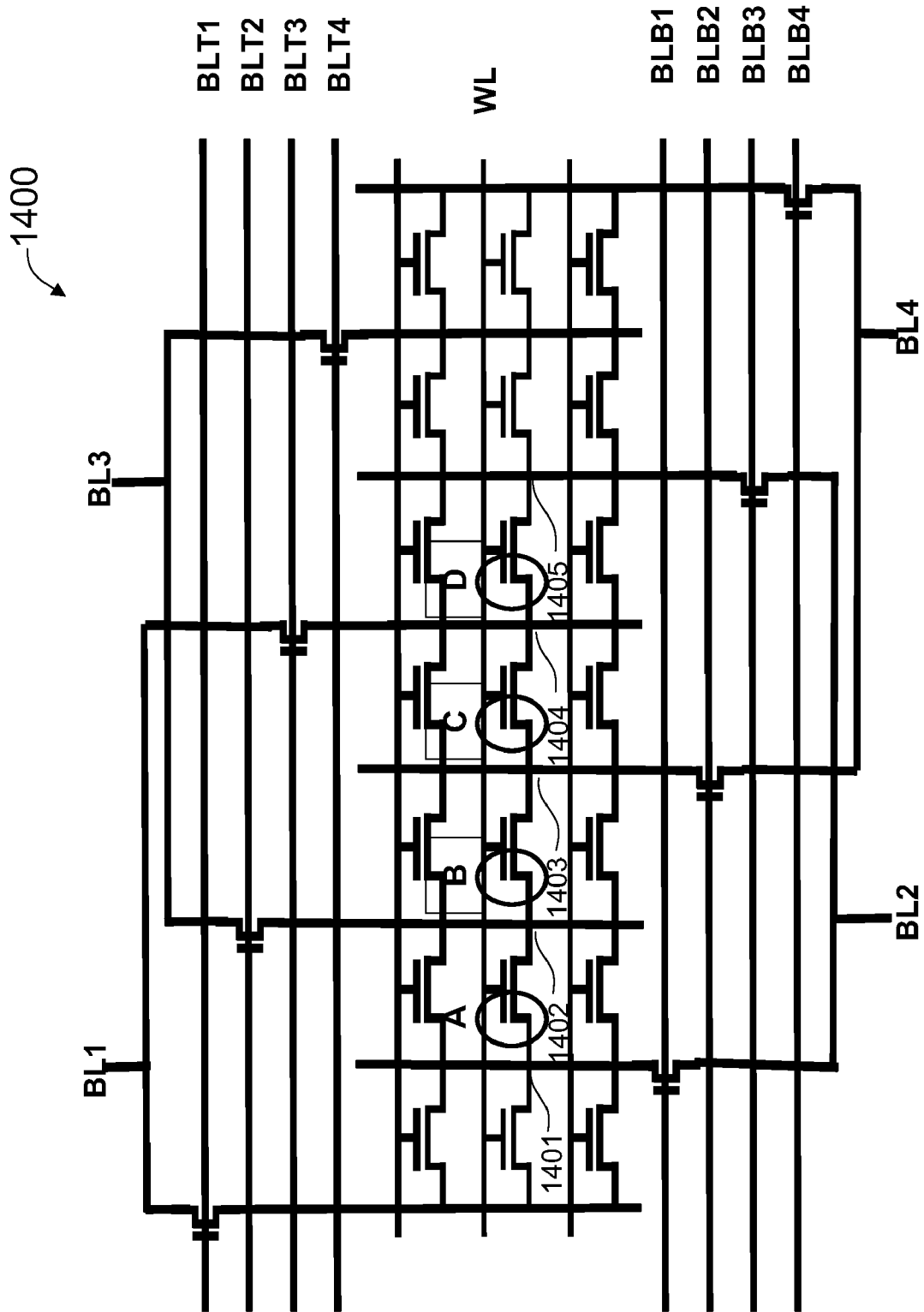
FIG. 14 is a simplified view diagram illustrating a programming method for the virtual ground nonvolatile memory array of FIG. 13 according to an embodiment of the present invention.

FIG. 14 is a simplified view diagram illustrating a programming method for programming for the virtual ground nonvolatile memory array 1300 of FIG. 13 according to another embodiment of the present invention. As shown, memory array 1400 is similar to memory array 1300. Four memory cells are marked A, B, C, D, respectively. In the programming methods described above, an extended channel region is formed to reduce punch through current. For example, when programming cell A, a drain voltage is applied to doped region 1401 of cell A, a source voltage is applied to doped region 1403 of cell B, doped region 1402 between cell A and cell B is left floating. In addition, a word line voltage is applied to turn on cell A and cell B. Cell B could have a high or low threshold voltage depending on whether cell B has been programmed or erased. Therefore, the condition of cell B can cause variations in programming cell A. Similarly, when programming cell B, a combination of cell B and cell C is used. As a result the condition of cell C can affect the programming of cell B.

To reduce variations caused by data patterns in the memory cells, a programming sequence is provided in an embodiment of the invention. First, before programming, the memory cells are erased. Then a series of memory cells is programmed in a sequence such that the adjacent cell that provides the extended channel is erased. In FIG. 14, the preferred sequence of programming is A, B, C, and then D.

Figure 15:
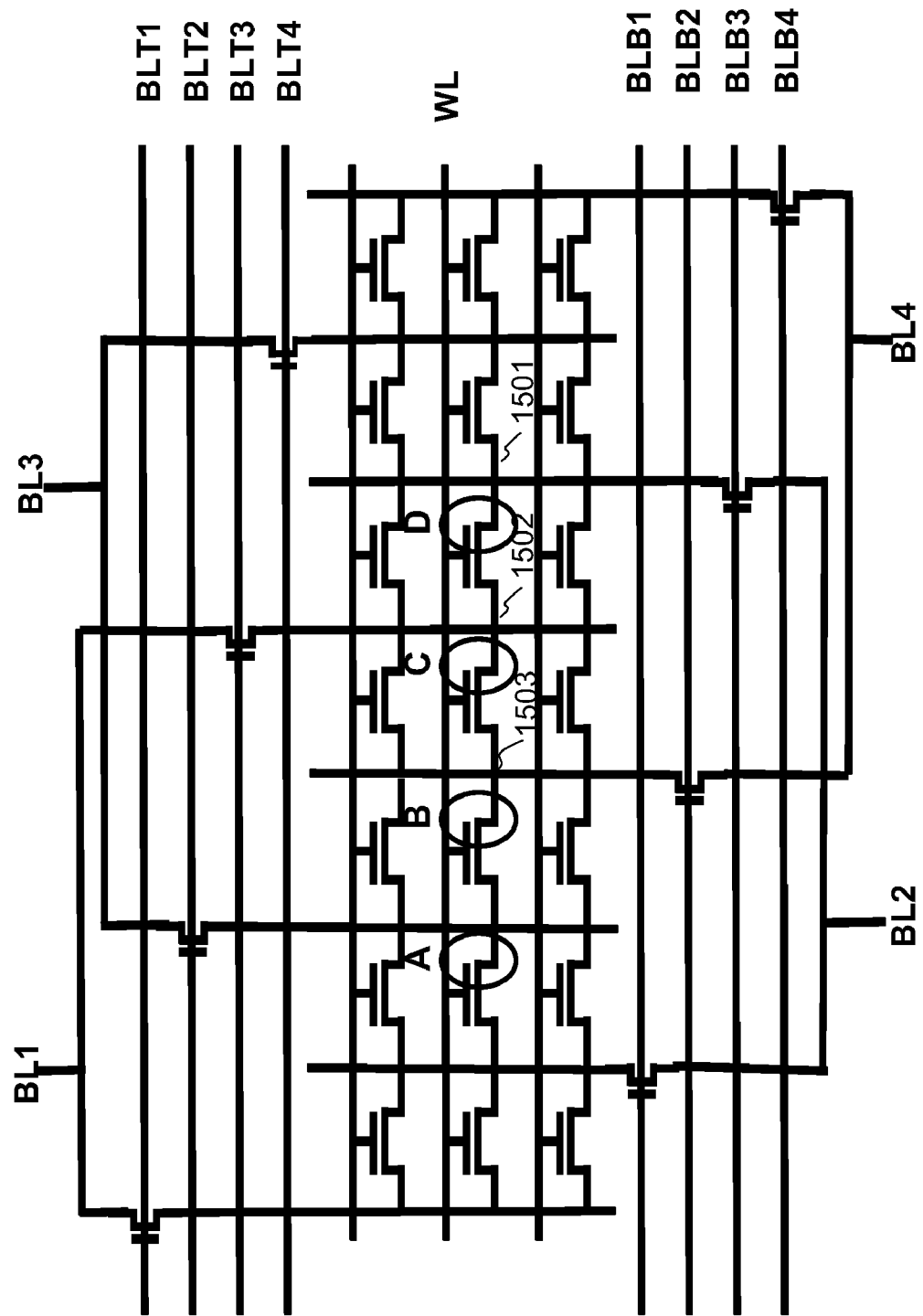
FIG. 15 is a simplified view diagram illustrating another programming method for the virtual ground nonvolatile memory array of FIG. 13 according to an alternative embodiment of the present invention.

In one example, the memory cells have a dielectric charge trapping material, e.g., nitride based charge storage material, in which each cell can hold charges in one of two portions of its charge storage material. In FIG. 14, to program the left hand side portion of each memory cell, the programming sequence discussed above can be used. In another example, it may be desirable to program the right hand side portion of the each memory cell, as shown in FIG. 15. In this example, cell D is programmed first, with a drain voltage on doped region 1501, a source voltage on doped region 1503, and a doped region 1502 floating, etc. The preferred programming sequence is then D, C, B, and then A. Note that for memory cell arrays having floating gate charge storage material, either sequence can be used, as long as the adjacent cell that provides the extended channel is erased.

Referring to the program sequences depicted in FIGS. 14 and 15, the invention provides a method for programming a plurality of memory cells numbered 1 to N in a memory array, where N is an integer. The plurality of memory cells include:

a plurality of gate regions numbered 1 to N, each gate region including a charge storage material;

a plurality of doped regions numbered 1 to N+1, each of the doped regions being disposed between two adjacent gate regions, the kth doped region being configured as a drain for the kth memory cell, the (k+1)th doped region being configured as a source for the kth memory cell and as a drain for the (k+1)th memory cell; and a word line coupled to a control gate of each of the plurality of memory cell.

The method for programming the plurality of memory cells includes, first, erasing each of the plurality of memory cells. Then, each of the plurality of memory cells is programmed in the order from cell 1 to cell N. The process for programming the kth memory cell, k=1 to N, can be briefly summarized below.

1. applying a first voltage to the word line to turn on the kth cell and the (k+1)th memory cell, the kth and the (k+1)th memory cells being erased memory cells;
2. applying a second voltage to the kth doped region;
3. floating the (k+1)th doped region; and
4. applying a third voltage to the (k+2)th doped region, Under such bias conditions, channel hot carriers are injected into a charge storage material in the kth memory cell to program the kth memory cell.

Figure 16:
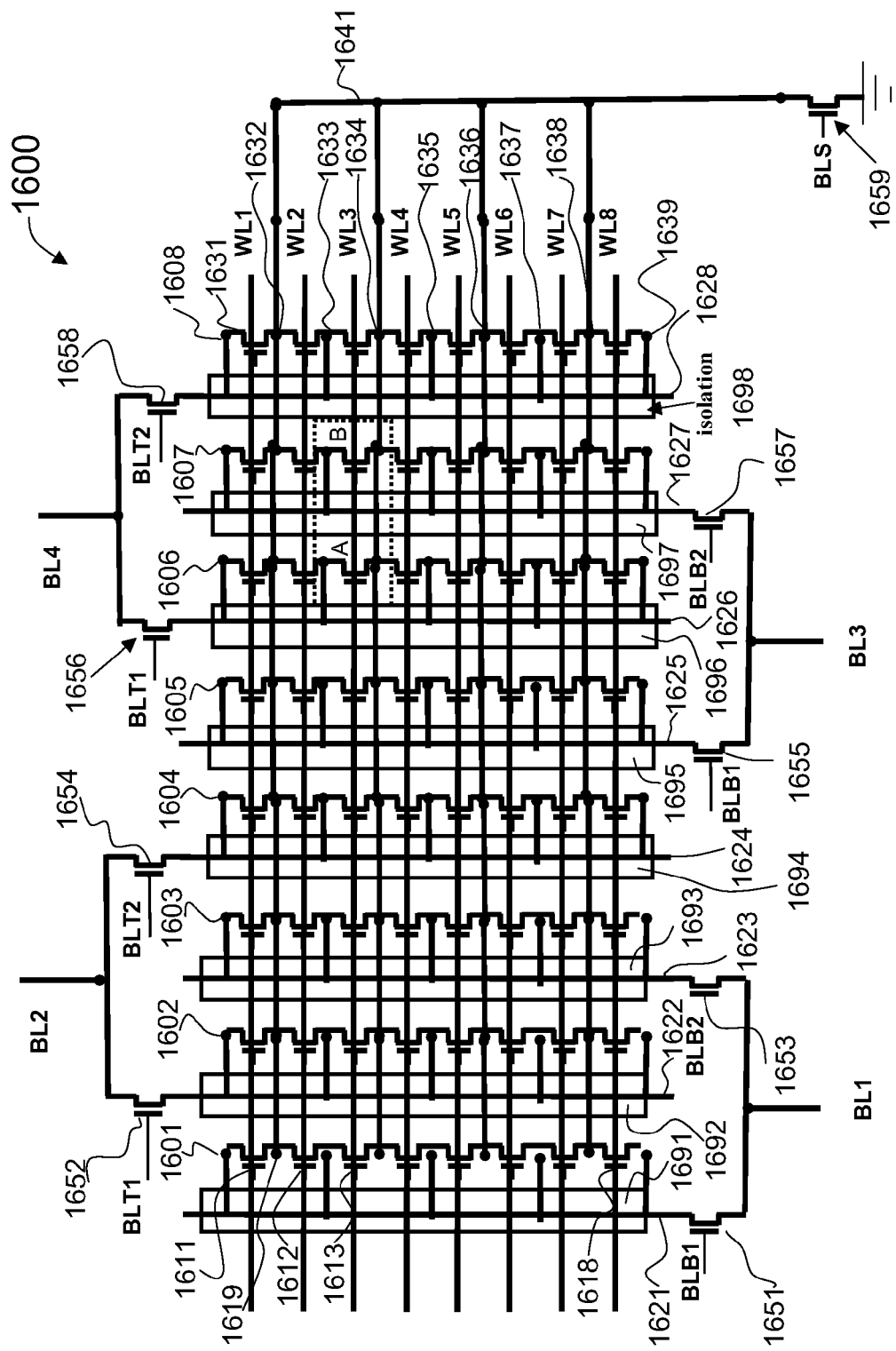
FIG. 16 is a simplified view diagram illustrating a nonvolatile memory array including isolation structures according to yet another embodiment of the present invention.

FIG. 16 is a simplified view diagram illustrating a nonvolatile memory array including isolation structures according to yet another embodiment of the present invention. This diagram is merely an example, which should not unduly limit the scope of the claims herein. One of ordinary skill in the art would recognize other variations, modifications, and alternatives. As shown, memory cell array 1600 includes a plurality of nonvolatile memory cell strings 1601, 1602, . . . , 1608. Each memory cell string being designated as the Mth memory cell string, where M=1 to 8. For example, string 1601 is the first string, string 1602 is the second string, etc. Adjacent memory cell strings being separated from each other by an isolation region, e.g., 1691, 1692, . . . , 1698. For example, memory cell string 1601 and 1602 are separated by isolation region 1692. Each memory cell strings includes a plurality of nonvolatile memory cells coupled in series. For example, memory cell string 1601 includes memory cells 1611, 1612, . . . , 1618, etc.

In array 1600, each memory cell can be a nonvolatile memory cell as described in FIG. 2A, 2B, or 3-9, or other non-volatile memory cells. Each memory cell includes two doped regions, which function as a source region or a drain region. Each memory cell also includes a channel region, a charge storage region above the channel region, and a gate. Each adjacent pair of memory cells share a doped region, i.e. the pair of memory cells are coupled together by the doped region. For example, cell 1611 and cell 1612 share doped region 1619.

Memory array 1600 also includes a plurality of word lines WL1, WL2, . . . , WL8. Each of the word lines is substantially perpendicular to the plurality of nonvolatile memory cell strings. As shown, each of the word lines is coupled to a memory cell from each of the plurality of nonvolatile memory cell strings. Additionally, memory cell array 1600 also includes a plurality of bit lines 1621, 1622, . . . , 1628. These bit lines are substantially parallel to the plurality of memory cell strings. Each bit line is designated as the Nth bit line, where N=1 to 8. For example, bit line 1621 is designated as bit line 1, bit line 1622 is designated as bit line 2, etc. Each bit line is coupled to every other doped region in a corresponding memory cell string. A global source line is coupled to every other doped region in each of the plurality of memory strings that are not coupled to any of the bit lines. For example, in memory cell string 1608 on the right hand side of memory cell array 1600, bit line 1628 is coupled to doped regions 1631, 1633, 1635, 1637, and 1639, whereas global source line 1641 is coupled to doped regions 1632, 1634, 1636, and 1638, etc.

Memory array 1600 also includes four global bit lines. A first global bit line BL1 is coupled to the first bit line 1621 and the third bit line 1623. A second global bit line BL2 is coupled to the second bit line 1622 and the fourth bit line 1624. A third global bit line BL3 is coupled to the fifth bit line 1625 and the seventh bit line 1627. A fourth global bit line BL4 is coupled to the sixth bit line 1626 and the eighth bit line 1628.

tile cells. For floating gate based cells, the cell bias conditions for operations such as programming, reading, and erasing, are similar to the methods described in connection with FIGS. 2A, 2B, and 3-5. For nitride based cells, he cell bias conditions for operations such as programming, reading, and erasing, are similar to the methods described in connection with FIGS. 2A, 2B, and 6-9. In memory arrays 1600 and 1700, these cell bias conditions are set up by applying appropriate voltages to the word lines, global bit lines, and select lines. A specific example is listed in Table 4 and discussed in further details below.

TABLE 4

|  | BL1 | BL2 | BL3 | BL4 | WL3 | BLT1 | BLT2 | BLB1 | BLB2 | BLS | P-well | Un-selected WL |
|---|---|---|---|---|---|---|---|---|---|---|---|---|
| Program BitA (CHE) | F | F | 0 V | 5 V | 10 V | 10 V | 0 V | 0 V | 10 V | 0 V | 0 V | 0 V or −Vg |
| Program BitB (CHE) | F | F | 5 V | 0 V | 10 V | 10 V | 0 V | 0 V | 10 V | 0 V | 0 V | 0 V or −Vg |
| Erase (BTBT HH for Nitride cell)) | 5 V | 5 V | 5 V | 5 V | −10 V | 10 V | 10 V | 10 V | 10 V | 0 V | 0 V |  |
| Erase (−FN for FG cell) | F | F | F | F | −20 V | 0 V | 0 V | 0 V | 0 V | 0 V | 0 V |  |
| Read BitA (forward read) | F | F | F | 0.6 V | 5 V | 10 V | 0 V | 0 V | 0 V | 5 V | 0 V | 0 V or −Vg |
| Read BitB (forward read) | F | F | 0.6 V | F | 5 V | 0 V | 0 V | 0 V | 10 V | 5 V | 0 V | 0 V or −Vg |

Memory array 1600 also has multiple select lines that control switch devices connecting the global bit lines to local bit lines. In FIG. 16, the select lines are not drawn, but are shown as control signals at the gate of each switch device. As shown, a first select line BLB1 is coupled to a first switch 1651 connecting the first global bit line BL1 to the first bit line 1621. The first select line BLB1 is also coupled to a fifth switch 1655 connecting the third global bit line BL3 to the fifth bit line 1625. A second select line BLT1 is coupled to a second switch 1652 connecting the second global bit line BL2 to the second bit line 1622. The second select line BLT1 is also coupled to a sixth switch 1656 connecting the fourth global bit line BL4 to the sixth bit line 1626. A third select line BLB2 is coupled to a third switch 1653 connecting the first global bit line BL1 to the third bit line 1623. The third select line BLB2 is also coupled to a seventh switch 1657 connecting the third global bit line BL3 to the seventh bit line 1627. A fourth select line BLT2 is coupled to a fourth switch 1654 connecting the second global bit line BL2 to the fourth bit line 1624. The fourth select line BLT2 is also coupled to an eighth switch 1658 connecting the fourth global bit line BL4 to the eighth bit line 1628. A fifth select line BLS is coupled to a ninth switch 1659 connecting the global source line 1641 to ground.

Figure 17:
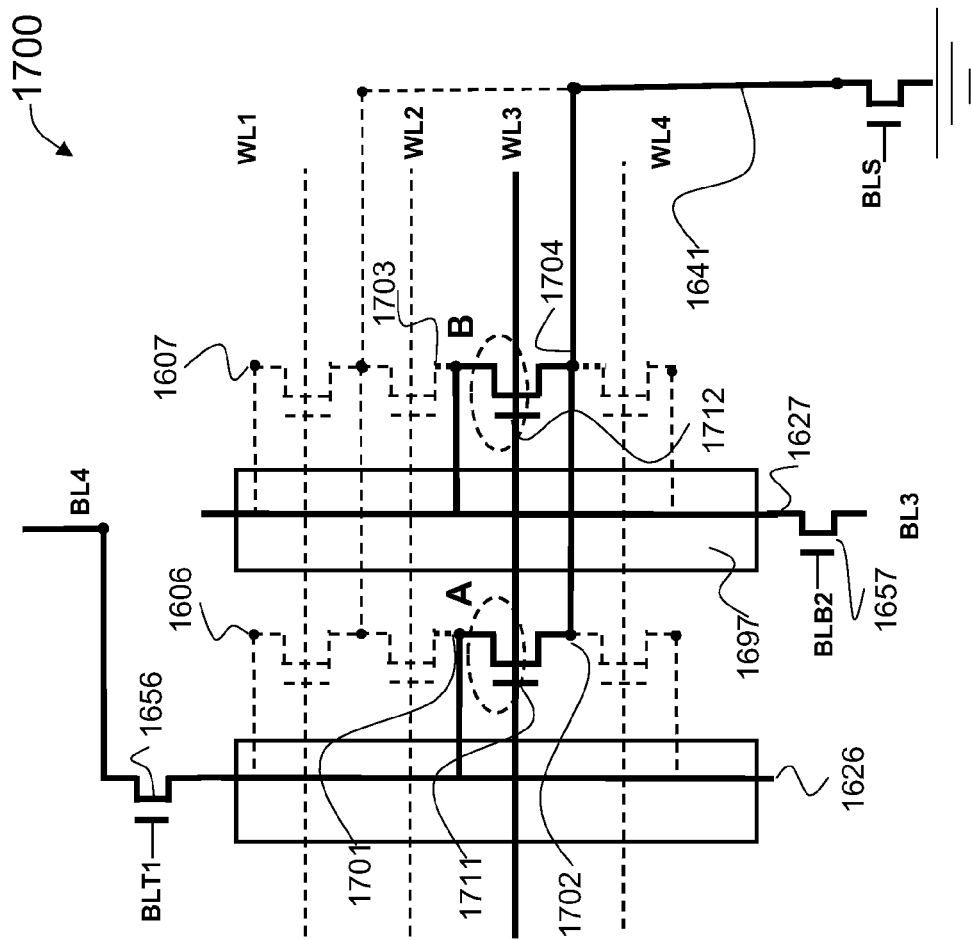
FIGS. 17 and 17A are simplified view diagrams illustrating a portion of the nonvolatile memory array of FIG. 16 according to an embodiment of the present invention.

FIG. 17 is a simplified view diagram illustrating a portion of the nonvolatile memory array 1600 of FIG. 16. FIG. 17 is used to illustrate various operations methods provided according to embodiments of the present invention. Some of the reference numerals from FIG. 16 are kept in FIG. 17. As shown in FIG. 17, a first memory cell A and a second memory cell B are separated by an isolation region 1697. Cell A is part of memory cell string 1606, and cell B is part of memory cell string 1607. Cell A includes a first doped region 1701, a second doped region 1702, and a first control gate 1711. Cell B includes a third doped region 1703, a fourth doped region 1704, and a second control gate 1712.

Depending on the embodiment, the memory cells can be floating gate based nonvolatile cells or nitride based nonvola- According to a specific embodiment, a method programming cell A can be briefly summarized below.
1. applying a first voltage (e.g. 0V) to a first global bit line (BL3);
2. applying a second voltage (e.g. 5V) to a second global bit line (BL4);
3. applying a third voltage (e.g. 10V) to a word line (WL3) coupled to the first control gate (1711) of the first cell and the second control gate (1712) of the second cell;
4. turning on select line BLB2 to couple global bit line BL3 to bit line 1627 and to couple the first voltage to the third doped region;
5. turning on select line BLT1 to couple global bit line BL4 to bit line 1626 and to couple the second voltage to the first doped region; and
6. turning off select line BLS to decouple global source line 1641 from a ground potential and to float the second doped region 1702 and the fourth doped region 1704 which are coupled to the global source line.

Referring to memory array 1600, the programming method also includes floating global bit lines BL1 and BL2 and turning off select lines BLT2 and BLB1. The substrate of the memory cell array is connected to a ground potential. Under the bias conditions described above, channel hot electrons (CHE) are injected to the charge storage material in cell A. It is noted that cell B can be programmed following a similar method, with 5V on BL3 and 0V on BL4.

Accordingly to another embodiment of the invention, the memory cells have a dielectric charge trapping material, e.g., nitride based charge storage materials. A method for erasing can be briefly summarized below.
1. applying a fourth voltage (e.g. 5V) to the global bit line (BL3) and the second global bit line (BL4);
2. applying a fifth voltage (e.g. −10V) to a word line (WL3) coupled to the first control gate (1711) of the first cell and the second control gate (1712) of the second cell;
3. applying a ground voltage (e.g. 0V) to the substrate;

4. turning on select lines BLT1, BLT2, BLB1, and BLB2 to couple global bit lines to the local bit lines and to the fourth voltage to the doped regions connected to the bit lines; and
5. turning off select line BLS to decouple source line 1641 from a ground potential and to float the doped regions which are coupled to the global source line.

Under the bias conditions described above, the control gate of cell A is biased at −10V and doped region 1701 is biased at 5V, and the substrate is at 0V. These bias conditions can cause band-to-band tunneling induced hot holes (BTBT HH) to be injected into the charge storage material to erase cell A. The same bias conditions are also present in cell B. Accordingly, cell B is also erased.

Accordingly to another embodiment of the invention, the memory cells have floating gate based charge storage materials. A method for erasing can be briefly summarized below.
1. applying a sixth voltage (e.g. −20V) to a word line (WL3) coupled to the first control gate (1711) of the first cell and the second control gate (1712) of the second cell;
2. applying a ground voltage (e.g. 0V) to the substrate;
3. floating the global bit lines; and
4. turning off the select lines to decouple the local bit lines and the global source line, and to float the doped regions.

Under the bias conditions described above, the control gate of cell A is biased at—−20V and doped region 1701 is floating, and the substrate is at 0V. These bias conditions can cause electron to be removed from the floating gate by Fowler-Nordheil (FN) tunneling. to erase cell A. The same bias conditions are also present in cell B. Accordingly, cell B is also erased.

Accordingly to another embodiment of the invention, a method for reading a memory cell, e.g. cell A in FIG. 17 can be briefly summarized below.
1. floating the first global bit line (BL3);
2. applying a seventh voltage (e.g. 0.6V) to a second global bit line (BL4);
3. applying an eight voltage (e.g. 5V) to a word line (WL3) coupled to the first control gate (1711) of the first cell;
4. turning off select line BLB2 to float bit line 1627 and to float the third doped region 1703;
5. turning on select line BLT1 to couple global bit line BL4 to bit line 1626 and to couple the seventh voltage to the first doped region 1701; and
6. turning on select line BLS to couple global source line 1641 to the ground potential and couple the second doped region 1702 to the ground potential.

Figure 17A:
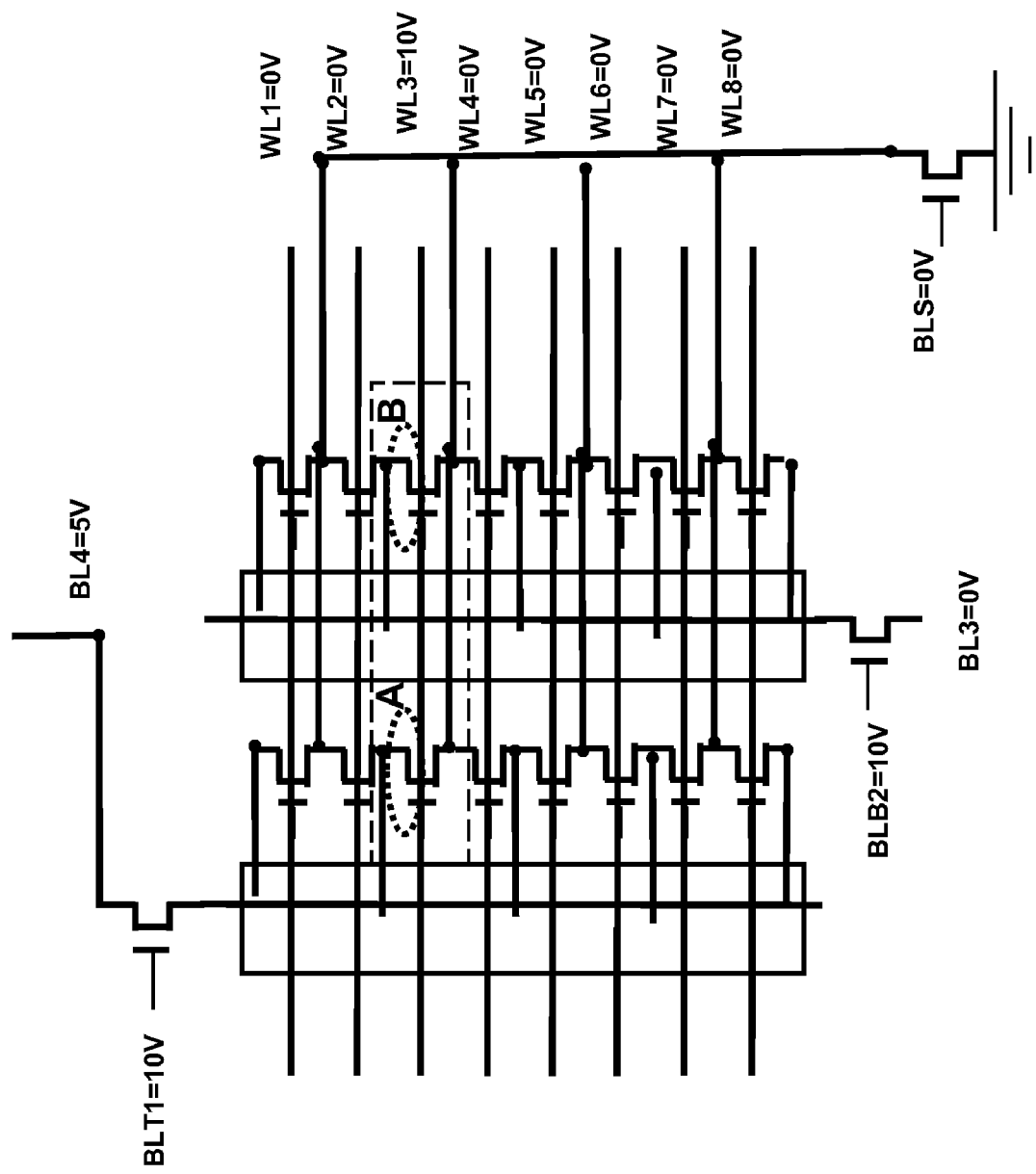

Referring to FIG. 17, the reading method also includes floating global bit lines BL1 and BL2 and turning off select lines BLT2 and BLB1. Under the bias conditions described above, memory cell A receives 0.6V at its drain, 5V at its gate, and a ground potential at its source. Under such bias conditions, a current provided at bit line 1626 is an indication of a threshold voltage of cell A. It is noted that cell B can be read following a similar method, but with 0.6V on BL3, floating BL4, turning off select line BLT1, and turning on select line BLB2. FIG. 17A is similar to FIG. 17, but includes more details regarding the neighboring cells adjacent to cells A and B.

In an alternative embodiment of the invention, array 1600 can be implemented using memory cells that are operated by band-to-band hot hole program to low Vt and FN tunneling erase to high Vt. Table 4A below summaries the various bias conditions. The detailed operations are similar to the discussion above in connection with Table 4.

TABLE 4A

|  | BL1 | BL2 | BL3 | BL4 | WL3 | BLT1 | BLT2 | BLB1 | BLB2 | BLS | P-well | Un-selected WL |
|---|---|---|---|---|---|---|---|---|---|---|---|---|
| Program BitA (BTBT HH) | F | F | 0 V | 5 V | −10 V | 10 V | 0 V | 0 V | 10 V | 0 V | 0 V | 0 V or −Vg |
| Program BitB (BTBT HH) | F | F | 5 V | 0 V | −10 V | 10 V | 0 V | 0 V | 10 V | 0 V | 0 V | 0 V or −Vg |
| Erase (+FN for FG cell) | 0 V | 0 V | 0 V | 0 V | +20 V | 10 V | 10 V | 10 V | 10 V | 0 V | 0 V |  |
| Erase (−FN for SiN cell) | F | F | F | F | −20 V | 0 V | 0 V | 0 V | 0 V | 0 V | 0 V |  |
| Read BitA (forward read) | F | F | F | 0.6 V | 5 V | 10 V | 0 V | 0 V | 0 V | 5 V | 0 V | 0 V or −Vg |
| Read BitB (forward read) | F | F | 0.6 V | F | 5 V | 0 V | 0 V | 0 V | 10 V | 5 V | 0 V | 0 V or −Vg |

The above sequences of steps provides methods of programming, reading, and erasing memory cells in a variety of memory arrays. As shown, the method uses a combination of steps including a way of applying bias voltages to word lines, global bit lines, and select lines. Other alternatives can also be provided where steps are added, one or more steps are removed, or one or more steps are provided in a different sequence without departing from the scope of the claims herein. Additionally, although the above has been described in terms of specific voltages, other voltages can be used depending on the embodiment. Further details of these other devices using the present method can be found throughout the present specification.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:
1. An integrated circuit, comprising:
a memory array on a substrate, including:
a plurality of memory cells arranged in rows and columns, each memory cell having two doped regions and a channel region therebetween, each pair of adjacent memory cells being coupled by a common doped region, each memory cell having a charge storage member over the channel region and a control gate over the charge storage member;
a first word line coupled to the memory cells in the same row, each of the memory cells designated as the Nth memory cell;
a plurality of bit lines, each bit line designated as the Nth bit line, the Nth bit line coupled to a doped region shared by the Nth memory cell and the (N−1) memory cell;
a first global bit line coupled to the first bit line and the fifth bit line;
a second global bit line coupled to the third bit line and the seventh bit line;
a third global bit line coupled to the second bit line and the sixth bit line;

a fourth global bit line coupled to the fourth bit line and the eighth bit line;

a first select line coupling the first global bit line to the first bit line via a first switch;

a second select line coupling the second global bit line to the third bit line via a second switch;

a third select line coupling the first global bit line to the fifth bit line via a third switch;

a fourth select line coupling the second global bit line to the seventh bit line via a fourth switch;

a fifth select line coupling the third global bit line to the second bit line via a fifth switch, the fifth select line coupling the third global bit line to the sixth bit line via a sixth switch; and a sixth select line coupling the fourth global bit line to the fourth bit line via a seventh switch, the sixth select line coupling the fourth global bit line to the eighth bit line via an eighth switch.

2. The integrated circuit of claim 1, wherein each of the plurality of memory cells comprises a charge storage member that includes a floating gate.

3. The integrated circuit of claim 1, wherein each of the plurality of memory cells comprises a charge storage member that includes a dielectric material.

4. The integrated circuit of claim 1, further comprising:
a circuit unit performing steps, comprising:
selecting a first memory cell and a second memory cell from the plurality of memory cells, the first memory cell including a first doped region, a second doped region, and a first channel region therebetween, the second memory cell including the second doped region, a third doped region, and a second channel region therebetween;
applying a bias arrangement to program the first memory, wherein the bias arrangement includes:
applying a substrate voltage to the substrate;
applying a first voltage to the first global bit line;
applying a second voltage to the second global bit line;
turning on the first switch to couple the first global bit line to the first bitline electrically connecting to the third doped region;
turning on the second switch to couple the second global bit line to the third bit line electrically connecting to the first doped region;
turning off the fifth switch to decouple the third global bit line from the second bit line connecting to the second doped region of the first memory cell;
applying a third voltage to a word line coupled to the first control gate of the first memory cell and the second control gate of the second memory cell.

5. The integrated circuit of claim 4, wherein the bias arrangement further comprises applying a ground or negative voltage to word lines not coupled to the first memory cell.

6. The integrated circuit of claim 4, wherein each of the plurality of memory cells is capable of holding multiple bits of information, the programming method further comprising programming the memory cell until a threshold voltage of the memory cell is within a predetermined range of a predetermined threshold voltage target.

7. The integrated circuit of claim 4, wherein the bias arrangement turns on the first channel region and the second region and injects a first type of charges to a charge storage layer of the first memory cell.

8. The integrated circuit of claim 7, wherein the circuit unit further comprises an erase bias arrangement including:
applying a fourth voltage to the substrate;
applying a fifth voltage to the second global bit line;

turning on the second switch to couple the second global bit line to the third bit line electrically connecting to the first doped region;
applying a six voltage to the word line coupled to the first control gate of the first memory cell,
whereby a second type of charges are injected to the charge storage layer of the first memory cell.

9. The integrated circuit of claim 7, wherein the circuit further comprises an erase bias arrangement including:
applying a fourth voltage to the word line coupled to the first control gate of the first memory cell; and
applying a fifth voltage to the substrate;
whereby the first type of charges are removed from the charge storage layer of the first memory cell.

10. The integrated circuit of claim 7, wherein the circuit further comprises an erase bias arrangement including:
applying a fourth voltage to the word line coupled to the first control gate of the first memory cell; and
applying a fifth voltage to the substrate, whereby a second type of charges are injected from the substrate to the charge storage layer of the first memory cell.

11. The integrated circuit of claim 4, wherein the bias arrangement injects a first type of charges to a charge storage layer of the first memory cell and is insufficient to turn on the first channel region.

12. The integrated circuit of claim 11, wherein the steps further comprise:
selecting a third memory cell adjacent to the first memory cell, the third memory cell comprising the first doped region, a fourth doped region, a third channel region therebetween, a third charge storage member overlying the third channel region, a third control gate overlying the third channel region;
applying a fourth voltage to the fourth global bit line;
turning on the seventh switch to couple the fourth global bit line to the fourth bit line electrically connecting to the fourth doped region, such that the third charge storage member are free from being programmed; wherein the fourth voltage is not more than the second voltage.

13. The integrated circuit of claim 11, wherein the circuit further comprises an erase bias arrangement including:
applying a fourth voltage to the substrate; and
applying a fifth voltage to the word line coupled to the first control gate of the first memory cell, whereby a second type of charges are injected from the first control gate to the charge storage layer of the first memory cell.

14. The integrated circuit of claim 11, wherein the circuit further comprises an erase bias arrangement including:
applying a fourth voltage to the second global bit line;
turning on the second switch to couple the second global bit line to the third bit line electrically connecting to the first doped region;
applying a fifth voltage to the word line coupled to the first control gate of the first memory cell; and
applying a sixth voltage to the substrate, whereby a second type of charges are injected from the substrate to the charge storage layer of the first memory cell.

15. The integrated circuit of claim 11, wherein the circuit further comprises an erase bias arrangement including:
applying a fourth voltage to the second global bit line;
turning on the second switch to couple the second global bit line to the third bit line electrically connecting to the first doped region;
applying a fifth voltage to the word line coupled to the first control gate of the first memory cell; and applying a sixth voltage to the substrate, whereby the first type of charges are removed from the charge storage layer of the first memory cell.

16. The integrated circuit of claim 4 wherein the circuit further comprises a read bias arrangement including:
applying a fourth voltage to the second global bit line;
applying a fifth voltage to the third global bit line;
turning on the second select line to couple the second global bit line to the third bit line electrically connecting to the first doped region of the first memory cell;
applying a sixth voltage to the word line coupled to the control gate of the first memory cell;
turning on the fifth select line to electrically couple the third global bit line to the second bit line electrically connecting to the second doped region of the first memory cell,
whereby a current associated with a threshold voltage of the first memory cell is provided at one of the second global line and the third global bit line.

17. An integrated circuit, comprising:
a memory array on a substrate including:
a plurality of memory cells arranged in rows and columns, each memory cell having two doped regions and a channel region therebetween, each pair of adjacent memory cells sharing a common doped region, each memory cell having a charge storage member over the channel region and a control gate over the charge storage member;
a first word line coupled to the memory cells in the same row, each of the memory cells designated as the Nth memory cell;
a plurality of bit lines, each bit line designated as the Nth bit line, the Nth bit line coupled to a doped region shared by the Nth memory cell and the (N−1)th memory cell;
a first global bit line coupled to the first bit line and the fifth bit line via a first switch and a second switch respectively;
a second global bit line coupled to the second bit line and the sixth bit line via a third switch and a fourth switch respectively;
a third global bit line coupled to the third bit line and the seventh bit line via a fifth switch and a sixth switch respectively;
a fourth global bit line coupled to the fourth bit line and the eighth bit line via a seventh switch and a eighth switch respectively.

18. The integrated circuit of claim 17, wherein each of the plurality of memory cells comprises a charge storage material that includes a floating gate.

19. The integrated circuit of claim 17, wherein each of the plurality of memory cells comprises a charge storage member that includes a dielectric material.

20. The integrated circuit of claim 17, further comprising:
a circuit unit performing steps comprising:
selecting a first memory cell and a second memory cell from a plurality of cells, wherein the first memory cell including a first doped region, a second doped region, a first channel region therebetween, a first charge storage member overlying the first channel region, and a first control gate overlying the first charge storage member, the second memory cell including the second doped region and a third doped region, a second channel region between the second doped region and the third doped region, and a second control gate overlying the second channel region
applying a bias arrangement to program the first memory, wherein the bias arrangement includes:
applying a substrate voltage to the substrate;
applying a first voltage to the first global bit line;
applying a second voltage to the third global bit line;
applying a third voltage to the word line coupled to the first control gate and the second control gate;
turning on the first switch to couple the first global bit line to the first bit line connecting to the third doped region;
turning on the fifth switch to couple the third global bit line to the third bit line connecting to the first doped region; and
turning off the third switch to decouple the second global bit line from the second bit line electrically connecting to the second doped region.

21. The integrated circuit of claim 20 further comprising applying a ground or negative voltage to word lines not coupled to the first memory cell.

22. The integrated circuit of claim 20 wherein each of the plurality of memory cells is capable of holding multiple bits of information, the programming method further comprising programming the memory cell until a threshold voltage of the memory cell is within a predetermined range of a predetermined threshold voltage target.

23. The integrated circuit of claim 20, wherein the bias arrangement turns on the first channel region and the second region and injects a first type of charges to a charge storage layer of the first memory cell.

24. The integrated circuit of claim 23, wherein the circuit unit further comprises an erase bias arrangement including:
applying a fourth voltage to the substrate;
applying a fifth voltage to the third global bit line;
turning on the fifth switch to couple the third global bit line to the third bit line connecting to the first doped region; and
applying a six voltage to the word line coupled to the first control gate of the first memory cell,
whereby a second type of charges are injected to the charge storage layer of the first memory cell.

25. The integrated circuit of claim 23, wherein the circuit unit further comprises an erase bias arrangement including:
applying a fourth voltage to the word line coupled to the first control gate of the first memory cell; and
applying a fifth voltage to the substrate;
whereby the first type of charges are removed from the charge storage layer of the first memory cell.

26. The integrated circuit of claim 23, wherein the circuit unit further comprises an erase bias arrangement including:
applying a fourth voltage to the word line coupled to the first control gate of the first memory cell; applying a fifth voltage to the substrate; whereby a second type of charges are injected from the substrate to the charge storage layer of the first memory cell.

27. The integrated circuit of claim 20, wherein the bias arrangement injects a first type of charges to a charge storage layer of the first memory cell and is insufficient to turn on the first channel region.

28. The integrated circuit of claim 27, wherein the steps further comprise:
selecting a third memory cell adjacent to the first memory cell, the third memory cell comprising the first doped region, a fourth doped region, a third channel region therebetween, a third charge storage member overlying the third channel region, a third control gate overlying the third channel region;
applying a fourth voltage to the fourth global bit line;
turning on the seventh switch to couple the fourth global bit line to the fourth bit line connecting to the fourth doped region, such that the third charge storage member are free from being programmed, wherein the fourth voltage is not more than the second voltage.

29. The integrated circuit of claim 27, wherein the circuit unit further comprises an erase bias arrangement including:
applying a fourth voltage to the substrate; and
applying a fifth voltage to the word line coupled to the first control gate of the first memory cell, whereby a second type of charges are injected from the first control gate to the charge storage layer of the first memory cell.

30. The integrated circuit of claim 27, wherein the circuit unit further comprises an erase bias arrangement including:
applying a fourth voltage to the third global bit line;
turning on the fifth switch to couple the third global bit line to the third bit line connecting to the first doped region;
applying a fifth voltage to the word line coupled to the first control gate of the first memory cell; and
applying a sixth voltage to the substrate, whereby a second type of charges are injected from the substrate to the charge storage layer of the first memory cell.

31. The integrated circuit of claim 27, wherein the circuit unit further comprises an erase bias arrangement including:
applying a fourth voltage to the third global bit line;
turning on the fifth switch to couple the third global bit line to the third bit line connecting to the first doped region;
applying a fifth voltage to the word line coupled to the first control gate of the first memory cell; and
applying a sixth voltage to the substrate, whereby the first type of charges are removed from the charge storage layer of the first memory cell.

32. The integrated circuit of claim 20, wherein the circuit unit further comprises a read bias arrangement including:
applying a fourth voltage to the third global bit line;
applying a fifth voltage to the second global bit line;
turning on the fifth switch to couple the third global bit line to the third bit line connecting to the first doped region;
turning on the third switch to couple the second global bit line to the second bit line connecting to the second doped region;
applying a sixth voltage to the word line coupled to the first control gate of the first memory cell,
whereby a current associated with a threshold voltage of the first memory cell is provided at one of the third global bit line and the second global line.

33. A method for programming the plurality of memory cells in the memory array as recited in claim 1, the memory cells numbered 1 to M, the method comprising:
erasing each of the plurality of memory cells; and
programming each of the plurality of memory cells in the order from cell 1 to cell M, wherein programming the Nth memory cell, N=1 to M, including:
applying a substrate voltage to the substrate;
applying a first voltage to the word line to turn on the Nth cell and the (N+1)th memory cell, the Nth and the (N+1)th memory cells being erased memory cells;
applying a second voltage to the Nth doped region;
floating the (N+1)th doped region; and
applying a third voltage to the (N+2)th doped region,
whereby hot carriers are injected into a charge storage material in the Nth memory cell to program the Nth memory cell.

34. A method for programming the plurality of memory cells in the memory array recited in claim 17, the memory cells numbered 1 to M, the method comprising:
erasing each of the plurality of memory cells; and
programming each of the plurality of memory cells in the order from cell 1 to cell M, wherein programming the Nth memory cell, N=1 to M, including:
applying a substrate voltage to the substrate;
applying a first voltage to the word line to turn on the Nth cell and the (N+1)th memory cell, the Nth and the (N+1)th memory cells being erased memory cells;
applying a second voltage to the Nth doped region;
floating the (N+1)th doped region; and
applying a third voltage to the (N+2)th doped region,
whereby hot carriers are injected into a charge storage material in the Nth memory cell to program the Nth memory cell;
wherein each gate region includes a dielectric based charge storage material, wherein programming the Nth memory cell causes hot carriers to be injected into a portion of the charge storage material of the Nth memory cell that is adjacent to the Nth doped region.

* * * * *